(12) United States Patent
Kawai et al.

(10) Patent No.: US 8,536,948 B2
(45) Date of Patent: Sep. 17, 2013

(54) POWER AMPLIFIER

(71) Applicant: Panasonic Corporation, Osaka (JP)

(72) Inventors: Yasufumi Kawai, Osaka (JP); Hiroyuki Sakai, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/712,547

(22) Filed: Dec. 12, 2012

(65) Prior Publication Data

US 2013/0099864 A1    Apr. 25, 2013

Related U.S. Application Data

(63) Continuation of application No. PCT/JP2011/000349, filed on Jan. 24, 2011.

(30) Foreign Application Priority Data

Jun. 21, 2010   (JP) .................... 2010-141044

(51) Int. Cl.
   *H03F 3/26* (2006.01)
(52) U.S. Cl.
   USPC ........ 330/276; 330/269; 330/286; 330/124 R; 330/295; 330/307
(58) Field of Classification Search
   USPC ............. 330/276, 269, 286, 124 R, 295, 307
   See application file for complete search history.

(56) References Cited

U.S. PATENT DOCUMENTS

| 4,282,491 A * | 8/1981 | MacMaster et al. .......... 330/286 |
| 5,107,223 A | 4/1992 | Sakai et al. |
| 5,644,272 A | 7/1997 | Dabrowski |
| 6,737,948 B2 | 5/2004 | Aoki et al. |
| 6,816,012 B2 | 11/2004 | Aoki et al. |
| 6,856,199 B2 | 2/2005 | Komijani et al. |
| 7,075,371 B2 | 7/2006 | Aoki et al. |
| 7,119,619 B2 | 10/2006 | Komijani et al. |

(Continued)

FOREIGN PATENT DOCUMENTS

| JP | 02-190003 A | 7/1990 |
| JP | 2000-506344 A | 5/2000 |

(Continued)

OTHER PUBLICATIONS

International Search Report mailed Apr. 19, 2011 issued in corresponding International Application No. PCT/JP2011/000349.

*Primary Examiner* — Patricia Nguyen
(74) *Attorney, Agent, or Firm* — McDermott Will & Emery LLP

(57) ABSTRACT

A power amplifier according to the present invention includes: an input-side transformer which has an annular primary coil which is a first metal line and a plurality of linear secondary coils which are second metal lines, and matches input impedance and divides the input signal into a plurality of split signals; push-pull amplifiers each including a pair of transistors for amplifying one of the split signals; and an output-side transformer which has an annular secondary coil which is a third metal line and a plurality of linear primary coils which are fourth metal lines, and combines the amplified split signals and matches output impedance, two input terminals of the pair of transistors being connected to each other via each of the second metal lines and two output terminal of the pair of transistors being connected to each other via each of the fourth metal lines.

18 Claims, 12 Drawing Sheets

(56) References Cited

U.S. PATENT DOCUMENTS

| | | |
|---|---|---|
| 7,330,076 B2 | 2/2008 | Komijani et al. |
| 7,425,869 B2 | 9/2008 | Aoki et al. |
| 7,733,183 B2 | 6/2010 | Komijani et al. |
| 7,834,686 B2 * | 11/2010 | Staszewski et al. ............. 330/51 |
| 7,990,220 B2 * | 8/2011 | Kondo et al. ................. 330/276 |
| 8,018,283 B2 | 9/2011 | Komijani et al. |
| 8,049,563 B2 | 11/2011 | Aoki et al. |
| 8,183,930 B2 * | 5/2012 | Kawakami et al. ........... 330/295 |
| 8,373,519 B2 * | 2/2013 | Sinha et al. ................... 333/101 |
| 2002/0135422 A1 | 9/2002 | Aoki et al. |
| 2003/0169113 A1 | 9/2003 | Komijani et al. |
| 2003/0184369 A1 | 10/2003 | Aoki et al. |
| 2005/0030098 A1 | 2/2005 | Aoki et al. |
| 2005/0140447 A1 | 6/2005 | Komijani et al. |
| 2006/0250187 A1 | 11/2006 | Aoki et al. |
| 2007/0030071 A1 | 2/2007 | Komijani et al. |
| 2008/0204139 A1 | 8/2008 | Komijani et al. |
| 2009/0002071 A1 | 1/2009 | Aoki et al. |
| 2010/0019857 A1 * | 1/2010 | McMorrow et al. ............ 333/32 |
| 2010/0237967 A1 | 9/2010 | Ueno et al. |
| 2010/0244955 A1 | 9/2010 | Komijani et al. |
| 2012/0001692 A1 | 1/2012 | Komijani et al. |

FOREIGN PATENT DOCUMENTS

| | | |
|---|---|---|
| JP | 2005-503679 A | 2/2005 |
| JP | 38-26369 B2 | 9/2006 |
| JP | 2008-263432 A | 10/2008 |
| JP | 2010-011469 A | 1/2010 |
| WO | WO-97/33337 A1 | 9/1997 |
| WO | WO-02/31967 A2 | 4/2002 |
| WO | WO-2009/047876 A1 | 4/2009 |

* cited by examiner

POWER AMPLIFIER

CROSS REFERENCE TO RELATED APPLICATIONS

This is a continuation application of PCT International Patent Application No. PCT/JP2011/000349 filed on Jan. 24, 2011, designating the United States of America, which is based on and claims priority of Japanese Patent Application No. 2010-141044 filed on Jun. 21, 2010. The entire disclosures of the above-identified applications, including the specifications, drawings and claims are incorporated herein by reference in their entirety.

FIELD

The present invention relates to power amplifiers and, in particular, to a power amplifier for radio frequency application.

BACKGROUND

In recent years, development in Information Technology has been remarkable. The frequencies handled by communication devices move to higher frequencies from day to day, and even frequencies in millimeter waves band are utilized. Until recently, compound semiconductors having good insulation properties have been predominant radio frequency semiconductors.

However, advance of the scaling down in recent years has enabled transistors using conductive silicon-based substrates to obtain frequency bands in radio frequency close to those of the compound semiconductors. Moreover, the transistors using silicon-based substrates can be manufactured at lower cost than the compound semiconductors, and thus are expected to become increasingly popular from now on.

Most challenging to mount a radio frequency front-end and a digital circuit on one chip is to implement a power amplifier that employs an MOS (Metal Oxide Semiconductor) transistor. The advance of scaling down a silicon in recent years has improved the frequency bands in radio frequency. However, an oxide layer for use as a gate insulating film of the MOS transistor is extremely thin and thus the withstand voltage is low. For example, while the withstand voltage of several tens of volts is achieved in the compound semiconductors, the withstand voltage of merely up to about 2 V is achieved in the MOS transistors using silicon that are for use at radio frequency.

As described above, a sufficient withstand voltage is not obtained by one MOS transistor. To obtain high output power, it is necessary to combine outputs of a plurality of transistors. As a method for combining the outputs of a plurality of transistors, various combiners or power amplifiers have been proposed, examples of which include a Wilkinson-type power divider/combiner and the power amplifier disclosed in PTL 1.

PTL 1 discloses a technology known generally as a distributed active transformer (DAT). FIG. 1 is a diagram showing a configuration of a conventional power amplifier 10.

As shown in FIG. 1, the power amplifier 10 disclosed in PTL 1 includes a plurality of push-pull amplifiers 21, a plurality of slab inductors 22, and a metallic coil 23. The plurality of push-pull amplifiers 21 are interconnected annually via the plurality of slab inductors 22. The plurality of slab inductors 22 functions as primary windings, and the metallic coil 23 functions as a secondary winding.

The power amplifier 10 disclosed in PTL 1 further includes a spiral transformer balun 30, differential lines 40 and 41, and a distributed network 50, to match input impedance. The distributed network 50 provides, to the gates of transistor pair included in the push-pull amplifier, a balanced input signal inputted via the spiral transformer balun 30 and the differential lines 40 and 41.

CITATION LIST

Patent Literature

[PTL 1] Japanese Unexamined Patent Application Publication No. 2010-11469

SUMMARY

Technical Problem

However, the method disclosed in PTL 1 has the following problems:

The power amplifier disclosed in PTL 1 includes, as described above, the spiral transformer balun, the differential lines, and the distributed network, to match the input impedance. Thus, the line length to the push-pull amplifier is long and sufficient input power is not obtained, ending up increased losses. Moreover, the parts described above are required, which ends up requiring a complex circuit structure.

Thus, an object of the present invention is to provide a power amplifier which can reduce loss in an input-side matching circuit and allows for simplification and scale down of a circuit.

Solution to Problem

To solve the above problems, the power amplifier according to the present invention is a power amplifier for amplifying an input signal and outputting the amplified input signal as an output signal, the power amplifier including: a first transformer for matching input impedance and dividing the input signal into a plurality of split signals, the first transformer having a first metal line in an annular shape as a primary winding to which the input signal is inputted, and a plurality of second metal lines as secondary windings; a plurality of push-pull amplifiers, each push-pull amplifier including a pair of transistors for amplifying one of the plurality of split signals; and a second transformer having a third metal line in an annular shape as a secondary winding from which the output signal is outputted, and a plurality of fourth metal lines as primary windings, for combining the plurality of split signals amplified by the plurality of push-pull amplifiers to output the output signal and matching output impedance, wherein two input terminals of the pair of transistors are connected to each other via one of the second metal lines, and two output terminals of the pair of transistors are connected to each other via one of the fourth metal lines.

According to the above configuration, the input impedance and the output impedance can be matched without transmission lines. Thus, losses can be reduced. In addition, since the transmission lines are not used, simplification and scale down of a circuit can be achieved.

Moreover, a combined length of the plurality of second metal lines may be substantially equal to a length of the first metal line, and a combined length of the plurality of fourth metal lines may be substantially equal to a length of the third metal line.

According to the above configuration, the magnetic field coupling between the metal lines can be effectively utilized. Thus, the first transformer can distribute the input signal while minimizing the losses, and the second transformer can combine the plurality of split signals while minimizing the losses. Thus, power loss can be reduced.

Moreover, a mid-point of each of the second metal lines may be connected to a first power source for supplying a first bias voltage to the pair of transistors, and a mid-point of each of the fourth metal lines may be connected to a second power source for supplying a second bias voltage to the pair of transistors.

According to the above configuration, by utilizing the mid-points of the metal lines as bias supply points, the stability of the circuit improves.

Moreover, the first metal line may be disposed inside the third metal line in the annular shape.

According to the above configuration, the first metal line is disposed utilizing the region inside the third metal line in the annular shape, namely, the region enclosed by the third metal line. Thus, wasted regions can be reduced and scaling down the power amplifier can be achieved.

Moreover, the plurality of push-pull amplifiers may be disposed between the first metal line and the third metal line.

According to the above configuration, the region between the first metal line and the third metal line is effectively utilized. Thus, scaling down the power amplifier can be achieved.

Moreover, the first metal line and the plurality of second metal lines may be formed in a same metal line layer, and the third metal line and the plurality of fourth metal lines may be formed in a same metal line layer.

According to the above configuration, the inter-line distance can be set as desired. Thus, the coupling factor k of the magnetic field can be set as desired.

Moreover, the first metal line may be formed in a metal line layer different from a metal line layer in which the plurality of second metal lines is formed, and the third metal line may be formed in a metal line layer different from a metal line layer in which the plurality of fourth metal lines is formed According to the above configuration, the inter-line distance can be changed by changing the film thickness between the line layers. Thus, the coupling factor k of the magnetic field can be set as desired.

Moreover, the power amplifier may further include a dielectric layer having a thickness of 10 μm or greater, formed between a semiconductor substrate and at least one of the first transformer and the second transformer.

According to the above configuration, the transformers are formed using the line layers formed on the thick dielectric layer. Thus, the effects by the conductive semiconductor substrate can be suppressed and conductor losses can be reduced.

For example, the dielectric layer may comprise benzocyclobutene, polyimide, polytetrafluoroethylene, or polyphenylene oxide.

Moreover, the dielectric layer may include a nano-composite film formed of particles, consisting of a first material, dispersed in a second material.

According to the above configuration, a dielectric layer having a high relative permeability or a high relative permittivity can be implemented. Moreover, since selection can be made between the permittivity and the permeability, the flexibility in design is also allowed.

Moreover, at least one of the first transformer and the second transformer may be formed using a balun.

According to the above configuration, when the balun is used, the greater the relative permeability is, the stronger the magnetic field of the magnetic field coupling per unit length is. Thus, scaling down the power amplifier is possible.

Advantageous Effects

The power amplifier according to the present invention not only can reduce losses in the input-side matching circuit but also allows for simplification and scale down of a circuit.

BRIEF DESCRIPTION OF DRAWINGS

These and other objects, advantages and features of the invention will become apparent from the following description thereof taken in conjunction with the accompanying drawings that illustrate a specific embodiment.

DESCRIPTION OF EMBODIMENTS

Embodiment 1

Hereinafter, a power amplifier according to an embodiment 1 will be described, with reference to the accompanying drawings.

The power amplifier according to the present embodiment includes a plurality of push-pull amplifiers and differential transformer circuits. The plurality of push-pull amplifiers amplifies power. The differential transformer circuits include a differential transformer circuit which distributes an input signal to the plurality of push-pull amplifiers and also serves as an input-side matching circuit, and a differential transformer circuit which combines output from the plurality of push-pull amplifiers and also serves as an output-side matching circuit. The input-side differential transformer circuit is disposed inside the output-side differential transformer circuit.

Figure 1:
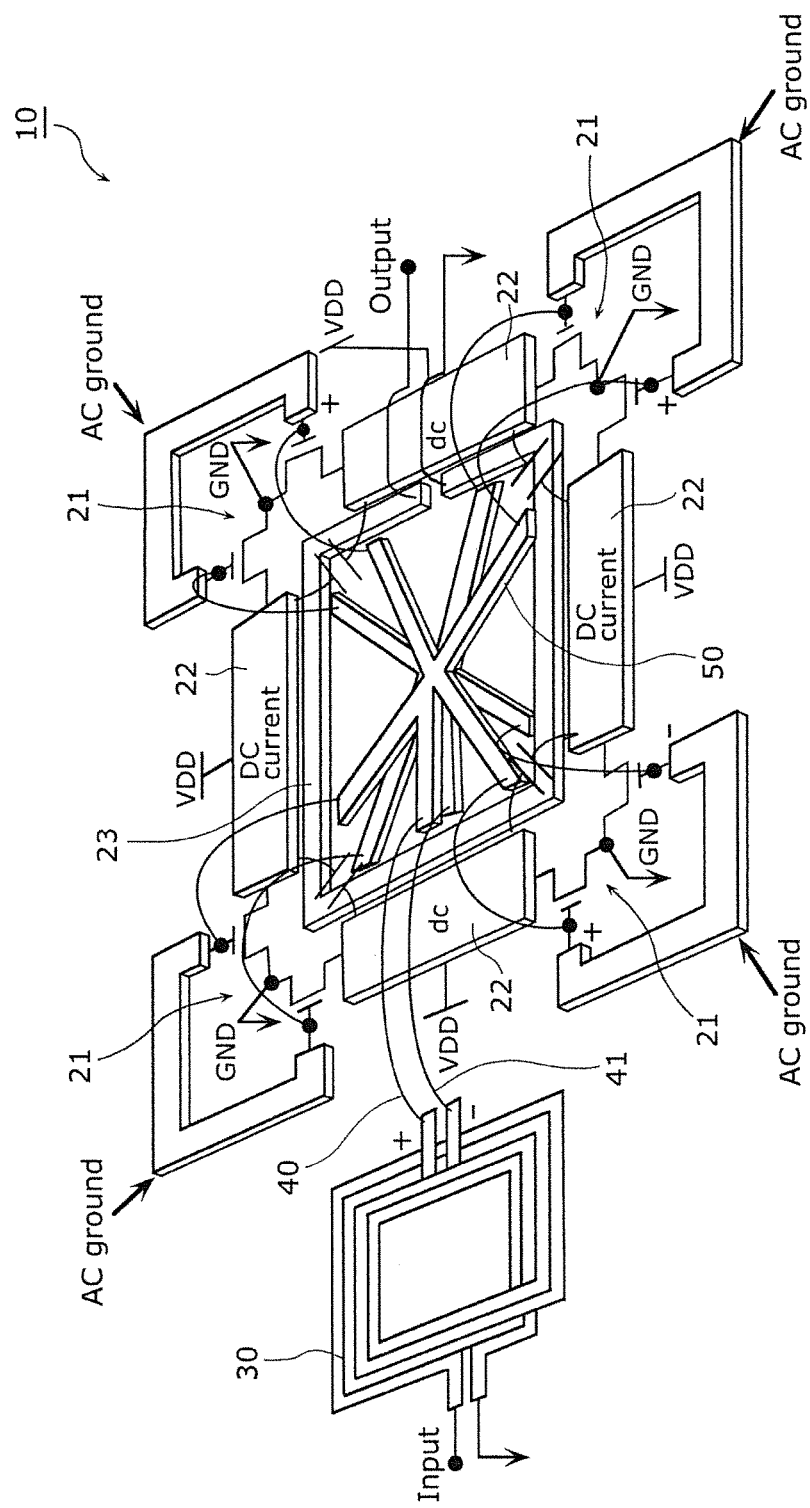
FIG. 1 is a diagram showing a configuration of a conventional power amplifier.
Figure 2:
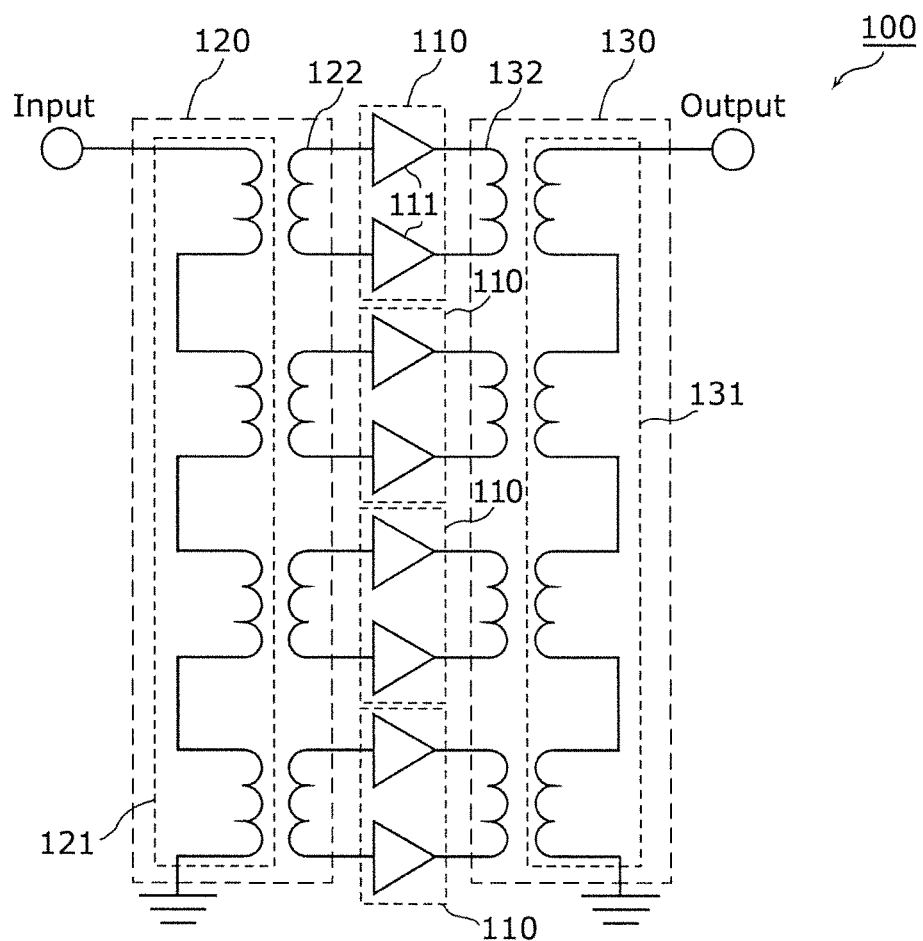
FIG. 2 is a diagram showing an example of a circuit structure of a power amplifier according to an embodiment 1.
Figure 3A:
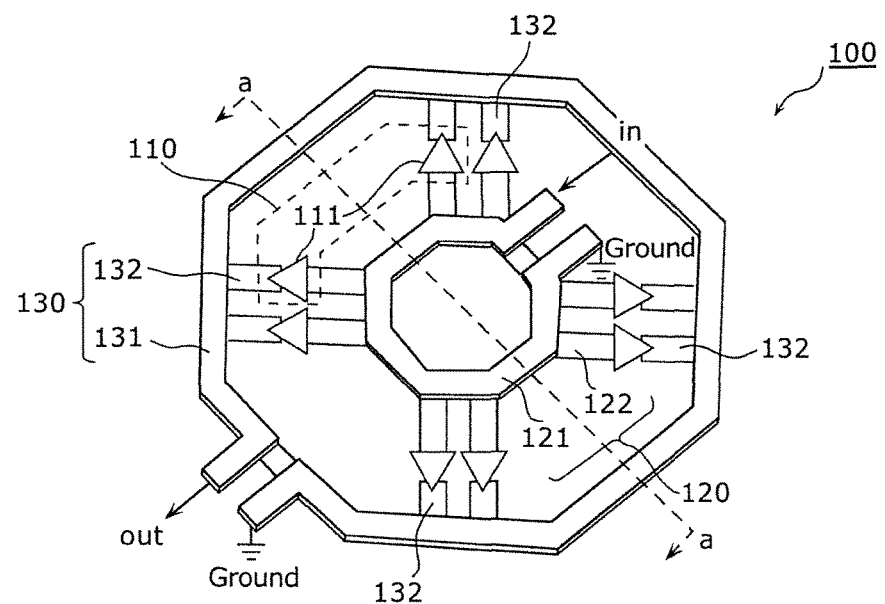
FIG. 3A is a schematic view showing an example of a structure of the power amplifier according to the embodiment 1.
Figure 3B:
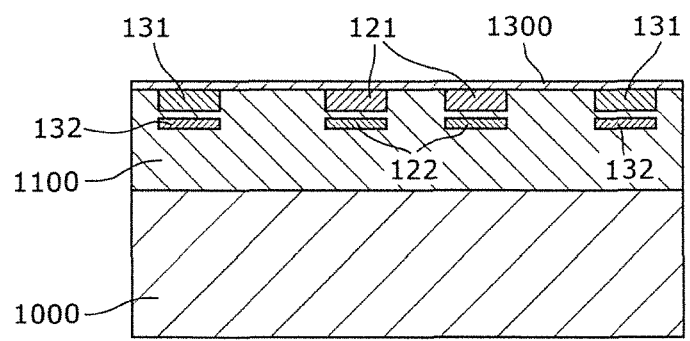
FIG. 3B is a diagram showing an example of a cross-sectional structure of the power amplifier according to the embodiment 1.

FIG. 2 is a diagram showing an example of a circuit structure of a power amplifier 100 according to the embodiment 1. FIG. 3A is a schematic view showing an example of a structure of the power amplifier 100 according to the embodiment 1. FIG. 3B is a diagram showing a cross-sectional structure along a dashed line a-a shown in FIG. 3A.

The power amplifier 100 according to the embodiment 1 is by way of example of a power amplifier which amplifies an input signal and outputs the amplified input signal as an output signal. As shown in FIG. 2, the power amplifier 100 includes a plurality of push-pull amplifiers 110, an input-side transformer 120, and an output-side transformer 130.

The plurality of push-pull amplifiers 110, the input-side transformer 120, and the output-side transformer 130 are formed on a substrate. As shown in FIG. 2 and FIG. 3A, the power amplifier 100 according to the present embodiment includes four of the push-pull amplifiers 110.

As shown in FIG. 2, the push-pull amplifiers 110 each include a pair of transistors including two transistors 111 which amplify the inputted signal. The configuration of the push-pull amplifiers 110 will be described below.

As shown in FIG. 3A, the push-pull amplifiers 110 are disposed between the input-side transformer 120 and the output-side transformer 130. Specifically, the push-pull amplifiers 110 are disposed outside the input-side transformer 120 and inside the output-side transformer 130.

The input-side transformer 120 is by way of example of a first transformer, and has an annular primary coil 121 and a plurality of linear secondary coils 122. The input-side transformer 120 matches input impedance and divides the input signal into a plurality of split signals. The plurality of split signals is outputted to the plurality of push-pull amplifiers 110. The input-side transformer 120 is by way of example of a differential distribution transformer which provides the input signal as differential signals to the plurality of push-pull amplifiers 110.

The annular primary coil 121 is by way of example of a first annular coil which includes a first metal line in an annular shape as a primary winding, and the input signal is inputted thereto. Specifically, as shown in FIG. 3A, the input signal is inputted to the annular primary coil 121 through one end, and the other end is grounded. Here, as an example, the input signal is inputted to the annular primary coil 121 through the one end and the other end is grounded. However, a differential input signal may be inputted to the annular primary coil 121 through both the ends.

The linear secondary coils 122 are by way of example of first linear coils which are second metal lines in a linear shape as secondary windings, and connected to the push-pull amplifiers 110. The linear secondary coils 122 and the annular primary coil 121 are close to each other and magnetically coupled. Using the magnetic field coupling, the input-side transformer 120 divides the input signal inputted to the annular primary coil 121 into a plurality of split signals and outputs the plurality of split signals to the push-pull amplifiers 110.

In the embodiment 1, to utilize the magnetic field coupling in the vertical direction, the first metal line is formed, as shown in FIG. 3B, in a metal line layer different from a metal line layer in which the second metal lines are formed. In other words, the annular primary coil 121 and the plurality of linear secondary coils 122 are formed in different metal line layers.

The combined length of the plurality of second metal lines is substantially equal to the length of the first metal line. In other words, the combined length of the plurality of linear secondary coils 122 is substantially equal to the length of the annular primary coil 121. It should be noted that being substantially equal naturally includes a case of being exactly equal but also includes a case of being regarded as substantially equal. For example, A and B being substantially equal may mean that A is 70% to 130% of B. Preferably, A and B being substantially equal may mean that A is 90% to 110% of B.

For example, the input-side transformer 120 is formed in a metal line layer which is a line layer formed according to general steps of what is known as semiconductor process. The input-side transformer 120 according to the present embodiment has a structure in which the annular primary coil 121 and the linear secondary coils 122 are stacked in the vertical direction. Specifically, the annular primary coil 121 is formed in a metal line layer different from a metal line layer in which the linear secondary coils 122 are formed. This achieves a high coupling factor k and allows coupling losses caused by the transformer to be suppressed.

As an example, the annular primary coil 121 is formed in an uppermost metal line layer in a manufacturing process for use. In the process used herein, the annular primary coil 121 has a thickness of 1.5 μm and is about 5.0 μm away from the substrate. The linear secondary coils 122 are formed in a metal line layer, which is one layer below the uppermost layer, and has a line thickness of 0.5 μm. The line spacing between the metal line layer in which the linear secondary coils 122 are formed and the uppermost metal line layer in which the annular primary coil 121 is formed is 0.5 μm. An Si semiconductor substrate 1000 has the resistivity of 10Ω·cm.

The metal line film thicknesses of the annular primary coil 121 and the linear secondary coils 122 are not limited to the above example. For example, the annular primary coil 121 may have a metal line film thickness of 0.1 μm to 10 μm. The linear secondary coils 122 may have a metal line film thickness of 0.1 μm to 10 μm. The line spacing between the annular primary coil 121 and the linear secondary coils 122 may be 0.1 μm to 10 μm.

In the input-side transformer 120, the annular primary coil 121 and the linear secondary coils 122 are formed so that the length of each of the linear secondary coils 122 is substantially ¼ the length of the annular primary coil 121. This is to reduce power losses of the input signal.

The output-side transformer 130 is by way of example of a second transformer, and has an annular secondary coil 131 and a plurality of linear primary coils 132. The output-side transformer 130 combines a plurality of split signals amplified by the plurality of push-pull amplifiers 110 to output a resultant signal as the output signal and matches the output impedance. The output-side transformer 130 is by way of example of a differential combination transformer which combines the split signals which are differential signals amplified by the plurality of push-pull amplifiers 110.

The annular secondary coil 131 is by way of example of a second annular coil which is a third metal line in an annular shape as a secondary winding, and outputs the output signal. Specifically, as shown in FIG. 3A, the output signal is outputted from the annular secondary coil 131 through the one end. In the present embodiment, the other end is grounded. However, the annular secondary coil 131 may be a differential output from which the output signal is also outputted through the other end.

The linear primary coils 132 are by way of example of second linear coils which are fourth metal lines in a linear shape as primary windings, and connected to the push-pull amplifiers 110. The linear primary coils 132 and the annular secondary coil 131 are close to each other and magnetically coupled. Using the magnetic field coupling, the output-side transformer 130 combines the plurality of split signals amplified by the plurality of push-pull amplifiers 110 and outputs a resultant signal from the annular secondary coil 131.

In the embodiment 1, to utilize the magnetic field coupling in the vertical direction, the third metal line is formed, as shown in FIG. 3B, in a metal line layer different from a metal line layer in which the fourth metal lines are formed. In other words, the annular secondary coil 131 and the plurality of linear primary coils 132 are formed in different metal line layers.

The combined length of the plurality of fourth metal lines is substantially equal to the length of the third metal line. In other words, the combined length of the plurality of linear primary coils 132 is substantially equal to the length of the annular secondary coil 131.

The output-side transformer 130 is formed through the same process as the input-side transformer 120 is formed. In other words, the output-side transformer 130 is also formed in a metal line layer which is a line layer formed according to the general steps of the semiconductor process.

As with the input-side transformer 120, the output-side transformer 130 according to the present embodiment has a structure in which the linear primary coils 132 and the annular secondary coil 131 are stacked in the vertical direction. Specifically, the annular secondary coil 131 is formed in a metal line layer different from a metal line layer in which the linear primary coils 132 are formed.

In the input-side transformer 120, the annular primary coil 121 and the linear secondary coils 122 are formed so that the length of each of the linear secondary coils 122 is substantially ¼ the length of the annular primary coil 121, while in the output-side transformer 130, the linear primary coils 132 and the annular secondary coil 131 are formed so that the length of the annular secondary coil 131 is substantially four times longer than the length of each of the linear primary coils 132. This is because the input-side transformer 120 divides the input signal, while the output-side transformer 130 combines the signals amplified by the plurality of push-pull amplifiers 110.

The linear primary coils 132 is formed in a metal line layer which is one layer below the uppermost metal line layer in a manufacturing process for use. In the process used herein, the linear primary coils 132 have a thickness of 0.5 μm, and the line spacing with the uppermost metal line layer is 0.5 μm. The annular secondary coil 131 is formed in the uppermost metal line layer. In the process used herein, the annular secondary coil 131 has a line thickness of 1.5 μm and is about 5.0 μm away from the substrate. The substrate has the resistivity of 10Ω·cm.

The metal line film thicknesses of the annular secondary coil 131 and the linear primary coils 132 are not limited to the above example. For example, the annular secondary coil 131 may have a metal line film thickness of 0.1 μm to 5 μm. The linear primary coils 132 may have a metal line film thickness of 0.1 μm to 5 μm. The line spacing between the annular secondary coil 131 and the linear primary coils 132 may be 0.1 μm to 10 μm.

The output-side transformer 130 and the input-side transformer 120 use the metal line layers for the primary coils and the secondary coils in an opposite manner. This is because the output-side transformer 130 and the input-side transformer 120 use the uppermost metal line layers for the coils (the annular primary coil 121 and the annular secondary coil 131) having longer lengths than the other coils. This can minimize the line losses.

As shown in FIG. 3A, the annular primary coil 121 of the input-side transformer 120 is disposed inside the annular secondary coil 131 of the output-side transformer 130. In other words, the first metal line making up the annular primary coil 121 is disposed inside the third metal line making up the annular secondary coil 131. Specifically, as shown in FIG. 3A, the first metal line in the annular shape is disposed inside the third metal line in the annular shape in a plane when viewing the power amplifier 100 according to the present embodiment from above.

In other words, it is required that the input-side transformer 120 is designed in a small size as compared to the output-side transformer 130 so as to be disposed inside the output-side transformer 130.

The characteristics of each transformer are determined by the coupling factor k and a coil length L. Specifically, in the case of the transformer in which the primary coil and the secondary coils are vertically stacked, the characteristics of the transformer are determined by the internal diameter, the line width, and the film thickness between the lines. These are different depending on the semiconductor process, and therefore obtained by calculation using a three-dimensional electromagnetic field analysis tool.

Figure 4:
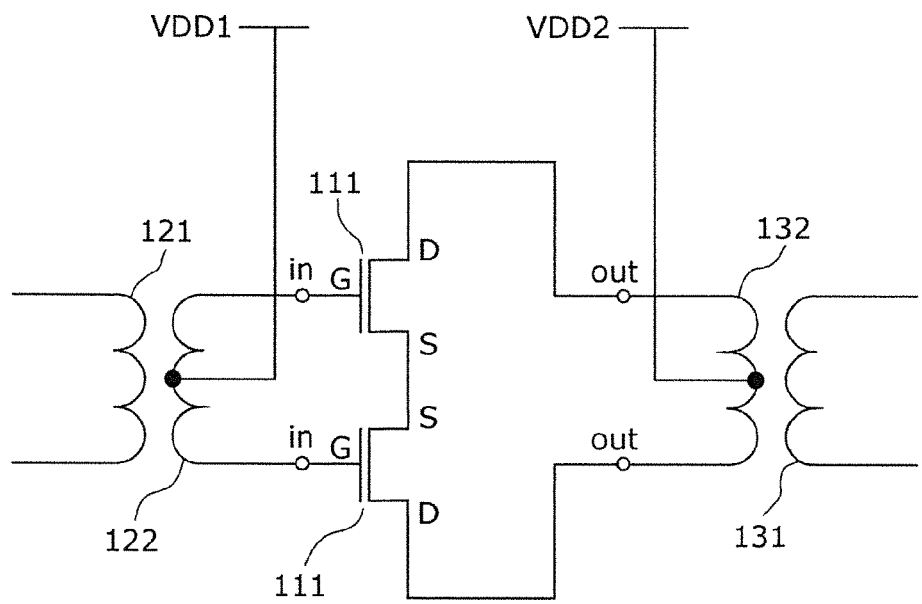
FIG. 4 is a diagram showing an example of a circuit configuration of a push-pull amplifier according to the embodiment 1.

Here, the push-pull amplifiers 110 will be described in detail, with reference to FIG. 4. FIG. 4 is a diagram showing an example of a circuit configuration of the push-pull amplifiers 110 according to the embodiment 1.

The push-pull amplifiers 110 each include a pair of transistors including two transistors 111. Moreover, the push-pull amplifiers 110 are circuits having input units and output units. The input unit has two input terminals having positive and negative polarities for the pair of transistors. The output unit has two output terminals having positive and negative polarities for the pair of transistors.

The two input terminals are connected to each other via the second metal line making up the linear secondary coil 122. Specifically, as shown in FIG. 4, the two input terminals are connected to both ends of the linear secondary coil 122. A feature of the push-pull amplifiers 110 is that the push-pull amplifiers 110 are driven by the transistors by the two equal-amplitude and anti-phased signals being inputted to the input units of the pair of transistors.

The two output terminals are connected to each other via the fourth metal line making up the linear primary coil 132.

Specifically, as shown in FIG. 4, the two output terminals are connected to both ends of the linear primary coil 132.

The push-pull amplifiers 110 each include a differential circuit as shown in FIG. 4. Due to this, the mid-point of the metal line connecting the two input terminals or the two output terminals of the pair of transistors can be used as a point at which DC bias is supplied, by connecting the mid-point of the metal line to the power source. The DC bias supply point is a virtual AC ground, and thus the stability of the circuit can be improved.

Specifically, both ends of the linear secondary coil 122 of the input-side transformer 120 are connected to the gates (the two input terminals) of the pair of transistors. Furthermore, through the mid-point, the second metal line making up the linear secondary coil 122 is connected to a first power source (VDD1) which supplies a gate bias voltage to the pair of transistors. In other words, the gate bias voltage is supplied by the linear secondary coil 122 through the mid-point.

Drain terminals (the two output terminals) of the pair of transistors are connected to both the ends of the linear primary coil 132 of the output-side transformer 130. Furthermore, through the mid-point, the fourth metal line making up the linear primary coil 132 is connected to a second power source (VDD2) which supplies a gate bias voltage to the pair of transistors. In other words, the drain bias voltage is supplied by the linear primary coil 132 through the mid-point, in the same manner as the gate bias voltage is supplied.

As shown in FIG. 3A, the plurality of push-pull amplifiers 110 are disposed between the first metal line making up the annular primary coil 121 and the third metal line making up the annular secondary coil 131. This can achieve to scale down the power amplifier 100.

Figure 5:
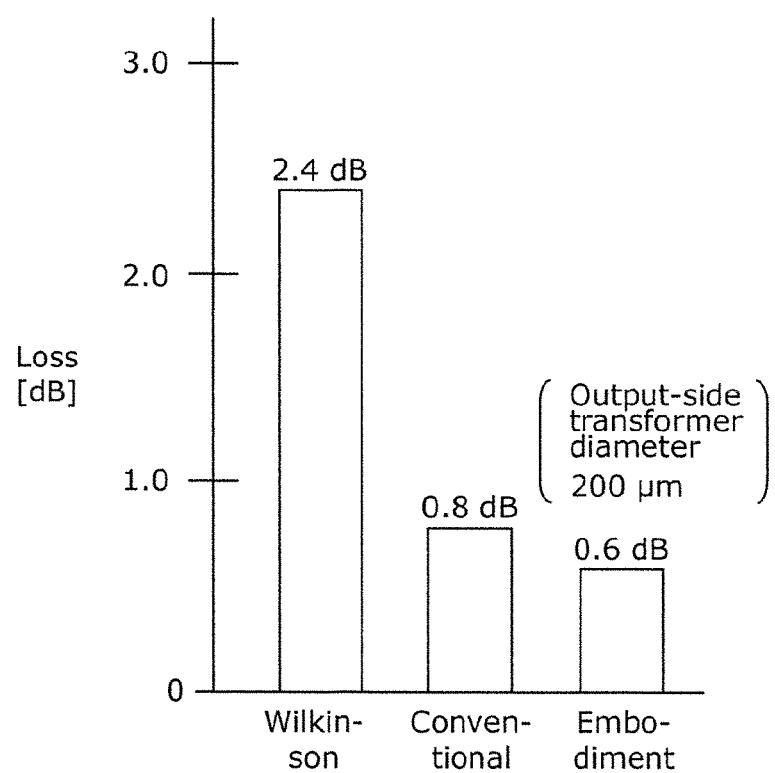
FIG. 5 is a comparison diagram of loss characteristics between conventional technology and the power amplifier according to the embodiment 1.

Hereinafter, advantages of the power amplifier 100 according to the present embodiment over the conventional Wilkinson power divider/combiner and the conventional technology disclosed in PTL 1 will be described with reference to FIG. 5. FIG. 5 is a comparison diagram of the loss characteristics between the conventional technology and the power amplifier according to the embodiment 1.

If a power amplifier is formed at the frequency of 60 GHz, using the Si semiconductor substrate that has the resistivity of 10Ω·cm, the present embodiment can reduce the losses by 80% as compared to the Wilkinson power divider/combiner and 25% as compared to the conventional technology disclosed in PTL 1. The circuit size also can be reduced by 90% as compared to the Wilkinson power divider/combiner and 35% as compared to the conventional technology disclosed in PTL 1. Thus, significant improvement is expected.

As described above, the power amplifier 100 according to the embodiment 1 includes the plurality of push-pull amplifiers 110, the input-side transformer 120, and the output-side transformer 130. The input-side transformer 120 has the annular primary coil and the plurality of linear secondary coils, matches the input impedance and divides the input signal into the plurality of split signals. The output-side transformer 130 has the plurality of linear primary coils and the annular secondary coil, combines the plurality of split signals and matches the output impedance. The push-pull amplifiers 110 each include the pair of transistors. The two input terminals of the pair of transistors are connected to each other via the second metal line, and the two output terminals are connected to each other via the fourth metal line.

Due to this, the transformers that include the annular coil and the plurality of linear coils match impedances, divide or combine the signal(s), thereby reducing the losses in the input-side matching circuit, and achieving simplification and scale down of a circuit.

For example, when transmission lines are used to match the input and output impedances, particularly, in a CMOS circuit using a silicon, the magnetic field reaches the substrate and thus losses in the transmission lines are great. In contrast, the power amplifier according to the embodiment 1 utilizes the first transformer, which is the differential distribution transformer, to match the input impedance, and the second transformer, which is the differential combination transformer, to match the output impedance. Thus, the transmission lines are not required and the losses can be reduced.

Moreover, in the power amplifier according to the embodiment 1, the first transformer in the annular shape which is the input transformer is disposed inside the second transformer in the annular shape which is the output transformer. In other words, the first transformer and the second transformer constitute a double-ring structure. Thus, the region inside the second transformer is effectively utilized, thereby scaling down the power amplifier.

Embodiment 2

In the embodiment 1, the input-side transformer 120 and the output-side transformer 130 are described as transformers utilizing the magnetic field coupling in the vertical direction. In contrast, an input-side transformer and an output-side transformer that are included in a power amplifier according to an embodiment 2 are transformers utilizing the magnetic field coupling in the horizontal direction between CPW (coplanar waveguide) type lines.

Figure 6A:
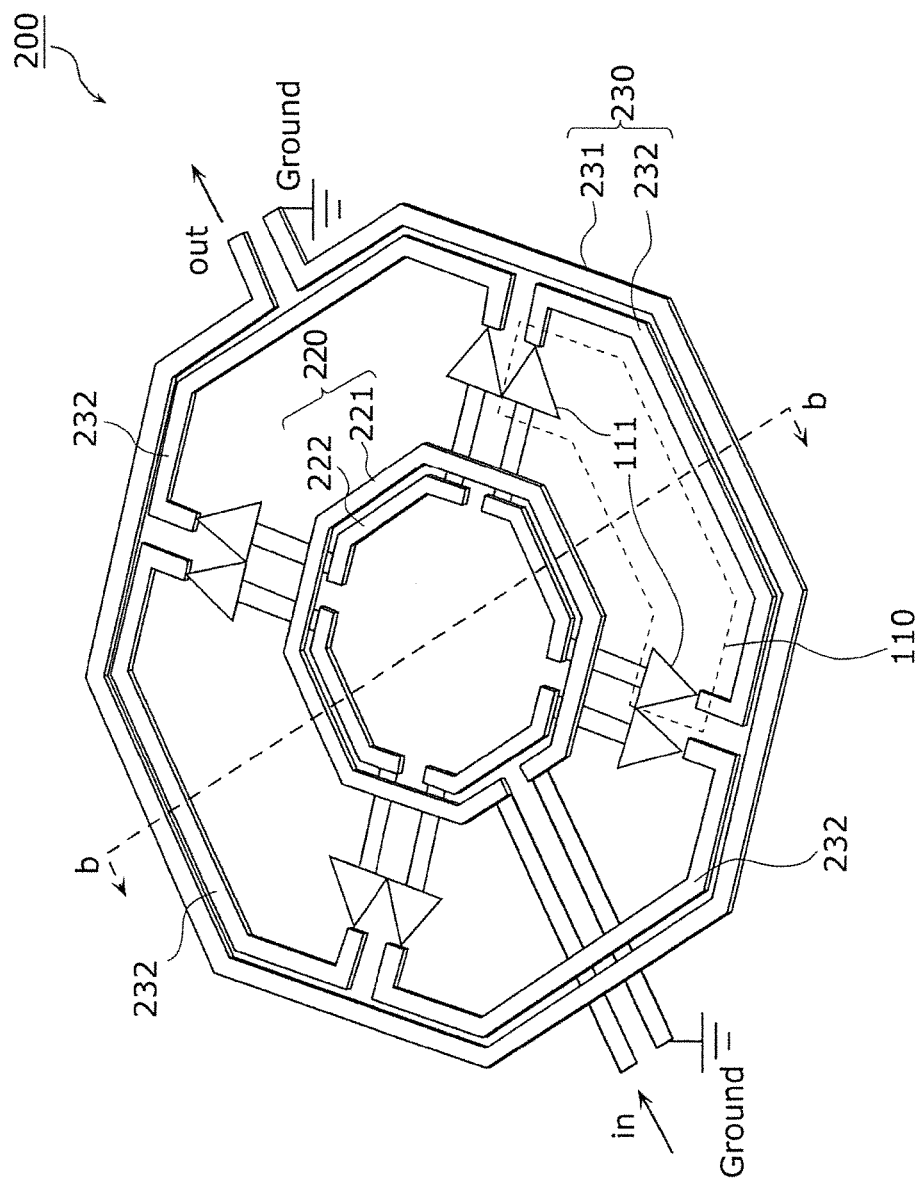
FIG. 6A is a schematic view showing an example of a structure of a power amplifier according to an embodiment 2.
Figure 6B:
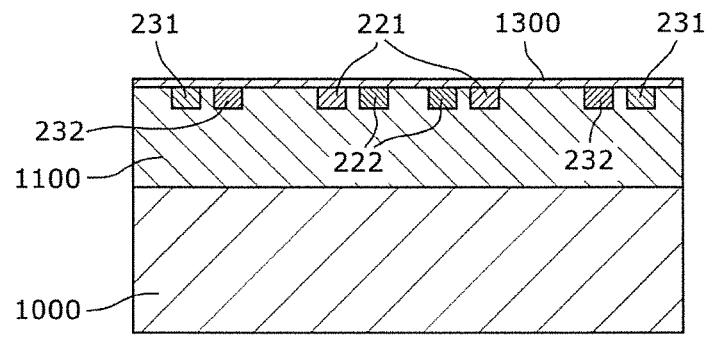
FIG. 6B is a diagram showing an example of a cross-sectional structure of the power amplifier according to the embodiment 2.

FIG. 6A is a schematic view showing an example of a structure of a power amplifier 200 according to the embodiment 2. FIG. 6B is a diagram showing a cross-sectional structure along a dashed line b-b shown in FIG. 6A.

As shown in FIG. 6A, the power amplifier 200 includes a plurality of push-pull amplifiers 110, an input-side transformer 220, and an output-side transformer 230. The same reference signs will be used in the embodiment 2 to refer to the same components as those of the power amplifier 100 according to the embodiment 1, and the description will be omitted.

The input-side transformer 220 is by way of example of a first transformer, and has an annular primary coil 221 and a plurality of linear secondary coils 222. The input-side transformer 220 matches input impedance and divides the input signal into a plurality of split signals. The plurality of split signals is outputted to the plurality of push-pull amplifiers 110. The input-side transformer 220 is by way of example of a differential distribution transformer which provides the input signal as differential signals to the plurality of push-pull amplifiers 110.

The annular primary coil 221 is by way of example of a first annular coil which includes a first metal line in an annular shape as a primary winding, and the input signal is inputted thereto. Specifically, as shown in FIG. 6A, the input signal is inputted to the annular primary coil 221 through one end, and the other end is grounded. Here, as an example, the input signal is inputted to the annular primary coil 221 through the one end and the other end is grounded. However, a differential input signal may be inputted to the annular primary coil 221 through both the ends.

The linear secondary coils 222 are by way of example of first linear coils which are second metal lines in a linear shape as secondary windings, and connected to the push-pull amplifiers 110. Moreover, the linear secondary coils 222 and the annular primary coil 221 are close to each other and magnetically coupled. Due to the magnetic field coupling, the input-side transformer 220 divides the input signal inputted to the annular primary coil 221 into a plurality of split signals and outputs the plurality of split signals to the push-pull amplifiers 110.

In the embodiment 2, since the magnetic field coupling in the horizontal direction is utilized, as shown in FIG. 6B, the first metal line and the second metal lines are formed in the same metal line layer. In other words, the annular primary coil 221 and the plurality of linear secondary coils 222 are formed in the same metal line layer.

The combined length of the plurality of second metal lines is substantially equal to the length of the first metal line. In other words, the combined length of the plurality of linear secondary coils 222 is substantially equal to the length of the annular primary coil 221.

For example, the annular primary coil 221 is formed in an uppermost metal line layer in a manufacturing process for use. In the process used herein, the annular primary coil 121 has a thickness of 1.5 µm and is about 5.0 µm away from an Si semiconductor substrate 1000. The linear secondary coils 222 are also formed in the uppermost metal line layer. The Si semiconductor substrate 1000 has the resistivity of 10Ω·cm.

The metal line film thicknesses of the annular primary coil 221 and the linear secondary coils 222 are not limited to the above example. For example, the annular primary coil 221 and the linear secondary coils 222 may have a metal line film thickness of 0.1 µm to 10 µm. The line spacing between the annular primary coil 221 and the linear secondary coils 222 may be 0.1 µm to 10 µm.

In the input-side transformer 220, the annular primary coil 221 and the linear secondary coils 222 are formed so that the length of each of the linear secondary coils 222 is substantially ¼ the length of the annular primary coil 221. This is to reduce power losses of the input signal.

According to the above configuration, the annular primary coil 221 and the linear secondary coils 222 are formed in the same metal line layer (here, the uppermost metal line layer), and thus line losses in the transformers can be reduced.

The output-side transformer 230 is by way of example of a second transformer, and has an annular secondary coil 231 and a plurality of linear primary coils 232. The output-side transformer 230 combines a plurality of split signals amplified by the plurality of push-pull amplifiers 110 to output a resultant signal as the output signal and matches the output impedance. The output-side transformer 230 is by way of example of a differential combination transformer which combines the split signals which are differential signals amplified by the plurality of push-pull amplifiers 110.

The annular secondary coil 231 is by way of example of a second annular coil which is a third metal line in an annular shape as a secondary winding, and outputs the output signal. Specifically, as shown in FIG. 6A, the output signal is outputted from the annular secondary coil 231 through the one end. In the present embodiment, the other end is grounded. However, the annular secondary coil 231 may be a differential output from which the output signal is also outputted through the other end.

The linear primary coils 232 are by way of example of second linear coils which are fourth metal lines in a linear shape as primary windings, and connected to the push-pull amplifiers 110. The linear primary coils 232 and the annular secondary coil 231 are close to each other and magnetically coupled. Using the magnetic field coupling, the output-side transformer 230 combines the plurality of split signals amplified by the plurality of push-pull amplifiers 110 and outputs a resultant signal from the annular secondary coil 231.

In the embodiment 2, since the magnetic field coupling in the horizontal direction is utilized, as shown in FIG. 6B, the third metal line and the fourth metal lines are formed in the same metal line layer. In other words, the annular secondary coil 231 and the plurality of linear primary coils 232 are formed in the same metal line layer.

The combined length of the plurality of fourth metal lines is substantially equal to the length of the third metal line. In other words, the combined length of the plurality of linear primary coils 232 is substantially equal to the length of the annular secondary coil 231.

The output-side transformer 230 is formed through the same process as the input-side transformer 220 is formed. In other words, the output-side transformer 230 is also formed in a metal line layer which is a line layer formed according to general steps of the semiconductor process.

As with the input-side transformer 220, in the output-side transformer 230, linear primary coils 132 and an annular secondary coil 131 use the CPW-type lines utilizing the magnetic field coupling in the horizontal direction.

In the input-side transformer 220, the annular primary coil 221 and the linear secondary coils 222 are formed so that the length of each of the linear secondary coils 222 is substantially ¼ the length of the annular primary coil 221, while in the output-side transformer 230, the linear primary coils 232 and the annular secondary coil 231 are formed so that the length of the annular secondary coil 231 is substantially four times longer than the length of each of the linear primary coils 232. This is because the input-side transformer 220 divides the input signal, while the output-side transformer 230 combines the signals amplified by the plurality of push-pull amplifiers 110.

The linear primary coils 232 are formed in the uppermost metal line layer in a manufacturing process for use. The annular secondary coil 231 is also formed in the uppermost metal line layer. In the process used herein, the annular secondary coil 231 has a line thickness of 1.5 µm and is about 5.0 µm away from the Si semiconductor substrate 1000. The Si semiconductor substrate 1000 has the resistivity of 10Ω·cm.

The metal line film thicknesses of the annular secondary coil 231 and the linear primary coils 232 are not limited to the above example. For example, the annular secondary coil 231 and the linear primary coils 232 may have a metal line film thickness of 0.1 µm to 10 µm. The line spacing between the annular secondary coil 231 and the linear primary coils 232 may be 0.1 µm to 10 µm.

According to the above configuration, the linear primary coils 232 and the annular secondary coil 231 can be formed in the same metal line layer (here, the uppermost metal line layer), and thus line losses in the transformers can be reduced.

The power amplifier 200 according to the embodiment 2 has the same circuit structure as the power amplifier 100 according to the embodiment 1 shown in FIG. 2, and thus the description will be omitted. The input-side transformer 220, the annular primary coil 221, the plurality of linear secondary coils 222, the output-side transformer 230, the annular secondary coil 231, and the plurality of linear primary coils 232 correspond to the input-side transformer 120, the annular primary coil 121, the plurality of linear secondary coils 122, the output-side transformer 130, the annular secondary coil 131, and the plurality of linear primary coils 132, respectively, in the circuit structure diagram shown in FIG. 2.

As described above, in the input-side transformer 220 included in the power amplifier 200 according to the embodiment 2, the annular primary coil 221 and the linear secondary coils 222 utilize the magnetic field coupling in the horizontal direction. Likewise, in the output-side transformer 230, the annular secondary coil 231 and the linear primary coils 232 utilize the magnetic field coupling in the horizontal direction.

The characteristics of each transformer are determined by a coupling factor k and a coil length L. In the case of the transformer in which the primary coil and the secondary coils are vertically stacked, the characteristics of the transformer are determined by the internal diameter, the line width, and the film thickness between the lines. However, once the manufacturing process is determined, the film thickness between the lines is, in general, unchangeable in that process. Thus, in the case of the transformer in which the primary coil and the secondary coils are vertically stacked, it is not largely free to set a parameter of the film thickness between the lines.

In contrast, the power amplifier according to the embodiment 2 employs the CPW-type lines utilizing the magnetic field coupling in the horizontal direction. Thus, the inter-line distance can be set as desired. Thus, as compared to the power amplifier according to the embodiment 1 utilizing the metal lines stacked in the vertical direction, the power amplifier according to the embodiment 2 allows a higher flexibility in setting the coupling factor k.

Embodiment 3

In the embodiments 1 and 2, the transformers have been described which utilize the magnetic field coupling in the vertical and horizontal directions, and are formed using the metal lines what is known as the inner layer lines that are generally for use in a silicon semiconductor process. In contrast, an input-side transformer and an output-side transformer included in a power amplifier according to an embodiment 3 are transformers utilizing the magnetic field coupling between transmission lines using the post-passivation interconnection process.

Figure 7A:
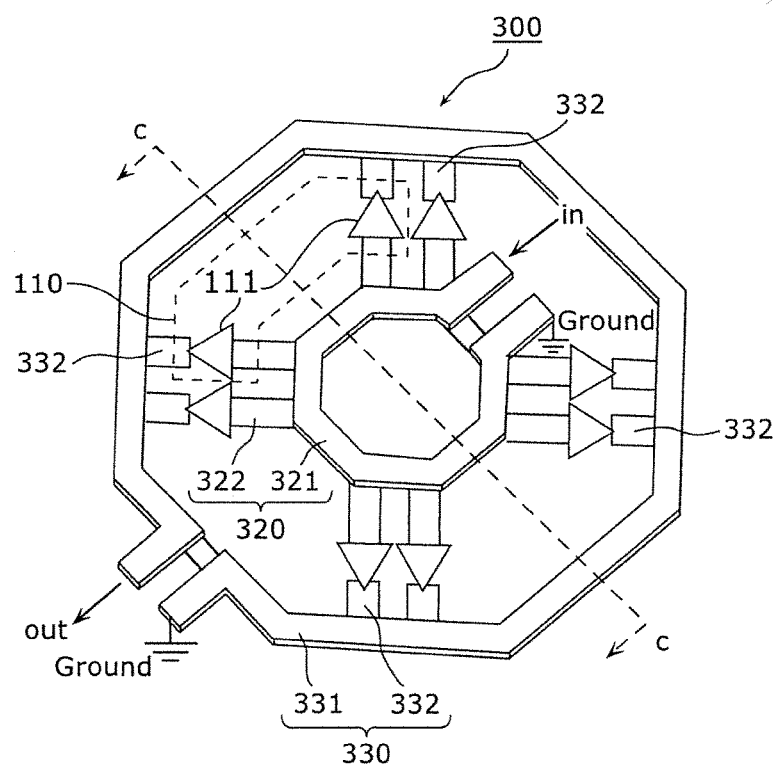
FIG. 7A is a schematic view showing an example of a structure of a power amplifier according to an embodiment 3.
Figure 7B:
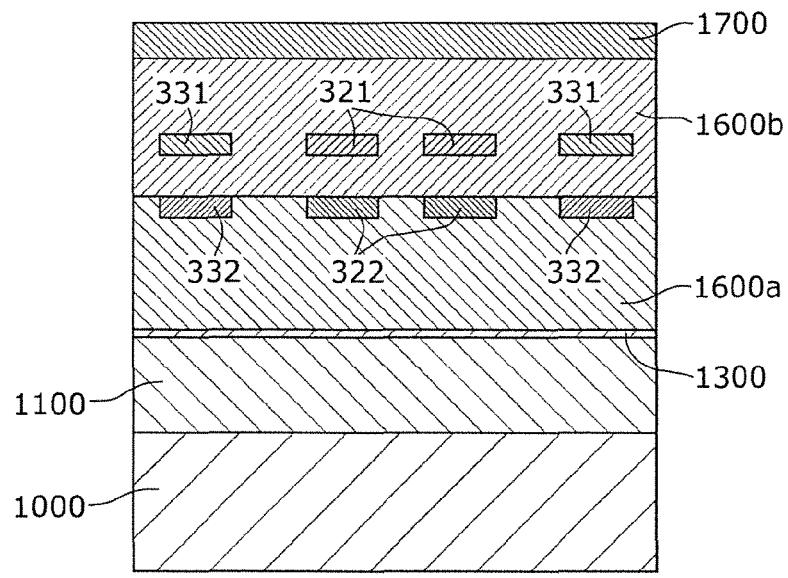
FIG. 7B is a diagram showing an example of a cross-sectional structure of the power amplifier according to the embodiment 3.

FIG. 7A is a schematic view showing an example of a structure of a power amplifier 300 according to the embodiment 3. FIG. 7B shows a cross-sectional structure along with a dashed line c-c shown in FIG. 7A. As shown in FIG. 7A, the power amplifier 300 includes a plurality of push-pull amplifiers 110, an input-side transformer 320, and an output-side transformer 330. The same reference signs will be used in the embodiment 3 to refer to the same components as those of the power amplifier 100 according to the embodiment 1, and the description will be omitted.

The input-side transformer 320 is by way of example of a first transformer, and has an annular primary coil 321 and a plurality of linear secondary coils 322. The input-side transformer 320 matches input impedance and divides the input signal into a plurality of split signals. The plurality of split signals is outputted to the plurality of push-pull amplifiers 110. The input-side transformer 320 is by way of example of a differential distribution transformer which provides the input signal as differential signals to the plurality of push-pull amplifiers 110.

The annular primary coil 321 is by way of example of a first annular coil which includes a first metal line in an annular shape as a primary winding, and the input signal is inputted thereto. Specifically, as shown in FIG. 7A, the input signal is inputted to the annular primary coil 321 through one end, and the other end is grounded. Here, as an example, the input signal is inputted to the annular primary coil 321 through the one end and the other end is grounded. However, a differential input signal may be inputted to the annular primary coil 321 through both the ends.

The linear secondary coils 322 are by way of example of first linear coils which are second metal lines in a linear shape as secondary windings, and connected to the push-pull amplifiers 110. The linear secondary coils 322 and the annular primary coil 321 are close to each other and magnetically coupled. Using the magnetic field coupling, the input-side transformer 320 divides the input signal inputted to the annular primary coil 321 into a plurality of split signals and outputs the plurality of split signals to the push-pull amplifiers 110.

The embodiment 3 utilizes the magnetic field coupling in the vertical direction, and thus the first metal line and the second metal lines are formed in different metal line layers. In other words, the annular primary coil 321 and the plurality of linear secondary coils 322 are formed in different metal line layers.

The combined length of the plurality of second metal lines is substantially equal to the length of the first metal line. In other words, the combined length of the plurality of linear secondary coils 322 is substantially equal to the length of the annular primary coil 321.

The input-side transformer 320 is formed by a process called post-passivation interconnection process.

The post-passivation interconnection process is a process which newly adds a thick dielectric layer and a line layer, in addition to the back end of line process. A line layer formed on a thick dielectric layer having a thickness greater than or equal to 10 μm is used to constitute a transmission line or a passive element. Thus, the effect by a conductive Si substrate can be suppressed and also conductor losses can be reduced. Benzocyclobutene, polyimide, polytetrafluoroethylene, polyphenylene oxide, or the like is used for the dielectric layer. In the present embodiment, benzocyclobutene (BCB) is used by way of example.

Figure 8:
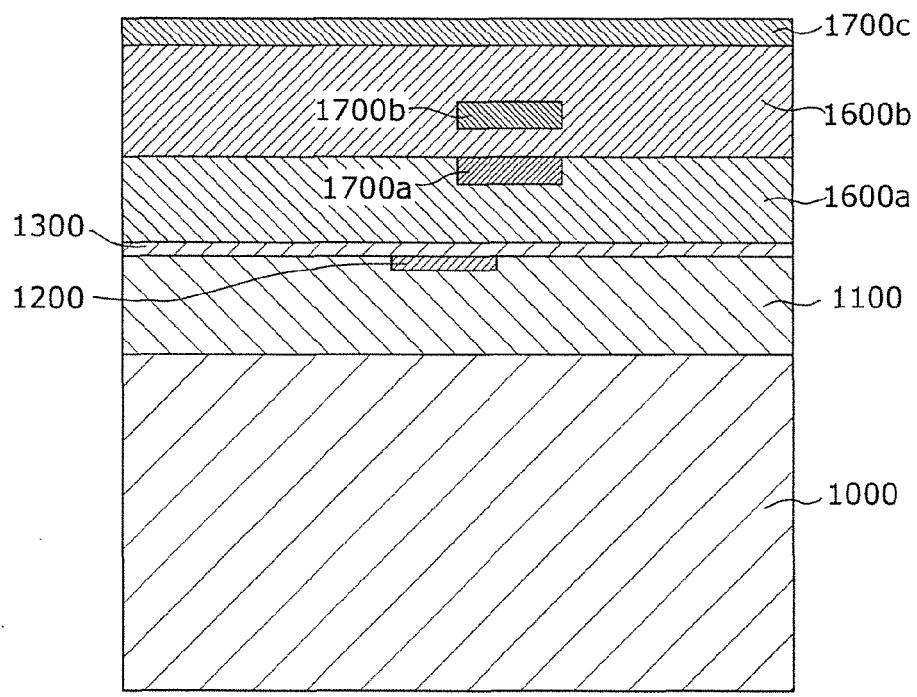
FIG. 8 is a cross-sectional view of a post-passivation interconnection process structure according to the embodiment 3.

An example of a line structure formed in the post-passivation interconnection process is shown in FIG. 8. The line structure shown in FIG. 8 includes an Si semiconductor substrate 1000, a back end processed dielectric layer 1100, and a back end processed line layer 1200, and a back end processed passivation film 1300, post-passivation interconnection process dielectric layers 1600a and 1600b, a post-passivation interconnection process lower line layer 1700a, a post-passivation interconnection process upper line layer 1700b, and a post-passivation interconnection process uppermost line layer 1700c.

The post-passivation interconnection process uppermost line layer 1700c is sized so as to cover substantially the entire surface of the circuits to be formed, and serve as a ground plane layer. Alternatively, the post-passivation interconnection process uppermost line layer 1700c may not be the ground plane layer. As with the CPW, the ground plane layers may be formed on both sides of a coupled line between the post-passivation interconnection process lower line layer 1700a and the post-passivation interconnection process upper line layer 1700b.

As with the input-side transformer 120 and the output-side transformer 130 according to the embodiment 1, the input-side transformer 320 can utilize the magnetic field coupling in the vertical direction. Specifically, the input-side transformer 320 is formed using the post-passivation interconnection process lower line layer 1700a and the post-passivation interconnection process upper line layer 1700b. In other words, as shown in FIG. 7B, the annular primary coil 321 and the plurality of linear secondary coils 322 are formed in different metal line layers.

The linear secondary coils 322 are formed in a metal line layer which is the post-passivation interconnection process lower line layer 1700a. In the post-passivation interconnection process used herein, as an example, the post-passivation interconnection process line layer has a thickness of 5 μm, and the film thickness between the post-passivation interconnection process lower line layer 1700a and the post-passivation interconnection process upper line layer 1700b is 5 μm.

The annular primary coil 321 is formed in a metal line layer which is the post-passivation interconnection process upper line layer 1700b. In the process used herein, the line thickness is 5 μm, and the post-passivation interconnection process lower line layer 1700a is about 20 μm away from a silicon substrate. The substrate has the resistivity of 10Ω·cm.

The metal line film thicknesses of the annular primary coil 321 and the linear secondary coils 322 are not limited to the above example. For example, the annular primary coil 321 and the linear secondary coils 322 may have a metal line film thickness of 0.1 μm to 10 μm. The thickness between the annular primary coil 321 and the linear secondary coils 322 may be 0.1 μm to 20 μm.

As with the input-side transformer 220 and the output-side transformer 230 according to the embodiment 2, the input-side transformer 320 may also utilize the magnetic field coupling in the horizontal direction. Specifically, the annular primary coil 321 and the plurality of linear secondary coils 322 included in the input-side transformer 320 are formed in the same metal line layer which is either the post-passivation interconnection process lower line layer 1700a or the post-passivation interconnection process upper line layer 1700b. In other words, the annular primary coil 321 and the plurality of linear secondary coils 322 are formed in the same metal line layer.

For example, the annular primary coil 321 is formed in a metal line layer which is the post-passivation interconnection process lower line layer 1700a. In the post-passivation interconnection process used herein, the post-passivation interconnection process line layer has a thickness of 5 μm and is about 15 μm away from the substrate. Likewise, the linear secondary coils 322 are formed in the metal line layer which is the post-passivation interconnection process lower line layer 1700a. Here, as an example, the post-passivation interconnection process lower line layer 1700a is used. However, the post-passivation interconnection process upper line layer 1700b may be used.

The metal line film thicknesses of the annular primary coil 321 and the linear secondary coils 322 are not limited to the above example. For example, the annular primary coil 321 and the linear secondary coils 322 may have a metal line film thickness of 0.1 μm to 50 μm. The line spacing between the annular primary coil 321 and the linear secondary coils 322 may be 0.1 μm to 20 μm.

In the input-side transformer 320, the annular primary coil 321 and the linear secondary coils 322 are formed so that the length of each of the linear secondary coils 322 is substantially ¼ the length of the annular primary coil 321. This is to reduce power losses of the input signal.

The output-side transformer 330 is by way of example of a second transformer, and has an annular secondary coil 331 and a plurality of linear primary coils 332. The output-side transformer 330 combines a plurality of split signals amplified by the plurality of push-pull amplifiers 110 to output a resultant signal as the output signal and matches the output impedance. The output-side transformer 330 is by way of example of a differential combination transformer which combines the split signals which are differential signals amplified by the plurality of push-pull amplifiers 110.

The annular secondary coil 331 is by way of example of a second annular coil which is a third metal line in an annular shape as a secondary winding, and outputs the output signal. Specifically, as shown in FIG. 7A, the output signal is outputted from the annular secondary coil 331 through the one end. In the present embodiment, the other end is grounded. However, the annular secondary coil 331 may be a differential output from which the output signal is also outputted through the other end.

The linear primary coils 332 are by way of example of second linear coils which are fourth metal lines in a linear shape as primary windings, and connected to the push-pull amplifiers 110. The linear primary coils 332 and the annular secondary coil 331 are close to each other and magnetically coupled. Using the magnetic field coupling, the output-side transformer 330 combines the plurality of split signals amplified by the plurality of push-pull amplifiers 110 and outputs a resultant signal from the annular secondary coil 331.

The combined length of the plurality of fourth metal lines is substantially equal to the length of the third metal line. In other words, the combined length of the plurality of linear primary coils 332 is substantially equal to the length of the annular secondary coil 331.

The output-side transformer 330 is formed through the same processing as the input-side transformer 320 is formed.

As with the input-side transformer 120 and the output-side transformer 130 according to the embodiment 1, the output-side transformer 330 can utilize the magnetic field coupling in the vertical direction. Specifically, the output-side transformer 330 is formed using the post-passivation interconnection process lower line layer 1700a and the post-passivation interconnection process upper line layer 1700b. In other words, as shown in FIG. 7B, the annular secondary coil 331 and the plurality of linear primary coils 332 are formed in different metal line layers.

The linear primary coils 332 are formed in a metal line layer which is the post-passivation interconnection process lower line layer 1700a. In the post-passivation interconnection process used herein, as an example, the post-passivation interconnection process line layer has a thickness of 5 μm, and the film thickness between the post-passivation interconnection process lower line layer 1700a and the post-passivation interconnection process upper line layer 1700b is 2 μm to 7 μm.

The annular secondary coil 331 is formed in a metal line layer which is the post-passivation interconnection process upper line layer 1700b. In the process used herein, the line thickness is 5 μm, and the post-passivation interconnection process lower line layer 1700a is about 20 μm away from a silicon substrate. The substrate has the resistivity of 10Ω·cm.

The metal line film thicknesses of the annular secondary coil 331 and the linear primary coils 332 are not limited to the above example. For example, the annular secondary coil 331 and the linear primary coils 332 may have a metal line film thickness of 0.1 μm to 50 μm. The thickness between the annular secondary coil 331 and the linear primary coils 332 may be 0.1 μm to 20 μm.

As with the input-side transformer 220 and the output-side transformer 230 according to the embodiment 2, the output-side transformer 330 may utilize the magnetic field coupling in the horizontal direction. Specifically, the annular secondary coil 331 and the plurality of linear primary coils 332 included in the output-side transformer 330 are formed in the same metal line layer which is either the post-passivation interconnection process lower line layer 1700a or the post-passivation interconnection process upper line layer 1700b. In other words, the annular secondary coil 331 and the plurality of linear primary coils are formed in the same metal line layer.

For example, the annular secondary coil 331 is formed in a metal line layer which is the post-passivation interconnection process lower line layer 1700a. In the post-passivation interconnection process used herein, the post-passivation interconnection process line layer has a thickness of 5 μm and is about 15 μm away from the substrate. Likewise, the linear primary coils 332 are formed in the metal line layer which is the post-passivation interconnection process lower line layer 1700a. Here, as an example, the post-passivation interconnection process lower line layer 1700a is used. However, the post-passivation interconnection process upper line layer 1700b may be used.

The metal line film thicknesses of the annular secondary coil 331 and the linear primary coils 332 are not limited to the above example. For example, the annular secondary coil 331 and the linear primary coils 332 may have a metal line film thickness of 0.1 μm to 50 μm. The line spacing between the annular secondary coil 331 and the linear primary coils 332 may be 0.1 μm to 20 μm.

The power amplifier 300 according to the embodiment 3 has the same circuit structure as the power amplifier 100 according to the embodiment 1 shown in FIG. 2, and thus the description will be omitted. The input-side transformer 320, the annular primary coil 321, the plurality of linear secondary coils 322, the output-side transformer 330, the annular secondary coil 331, and the plurality of linear primary coils 332 correspond to the input-side transformer 120, the annular primary coil 121, the plurality of linear secondary coils 122, the output-side transformer 130, the annular secondary coil 131, and the plurality of linear primary coils 132, respectively, in the circuit structure diagram shown in FIG. 2.

As described above, the input-side transformer 320 and the output-side transformer 330 included in the power amplifier 300 according to the embodiment 3 are formed using the post-passivation interconnection process.

Due to this, utilizing the post-passivation interconnection process, a line layer formed on a thick dielectric layer is used to constitute a transmission line or a passive element. Thus, the effect by a conductive Si substrate can be suppressed and also conductor losses can be reduced.

Embodiment 4

In the embodiments 1 and 2, the transformers have been described which utilize the magnetic field coupling in the vertical and horizontal directions, and are formed using the metal lines that are generally for use in a silicon semiconductor process. In the embodiment 3, the transformer utilizing the transmission line using the post-passivation interconnection process has been described.

In contrast, an input-side transformer included in a power amplifier according to an embodiment 4 is a transformer utilizing what is called the metal lines formed in the inner layer by the silicon semiconductor process described in the embodiments 1 and 2. An output-side transformer included in the power amplifier according to the embodiment 4 is a transformer utilizing transmission lines using the post-passivation interconnection process described in the embodiment 3.

Figure 9A:
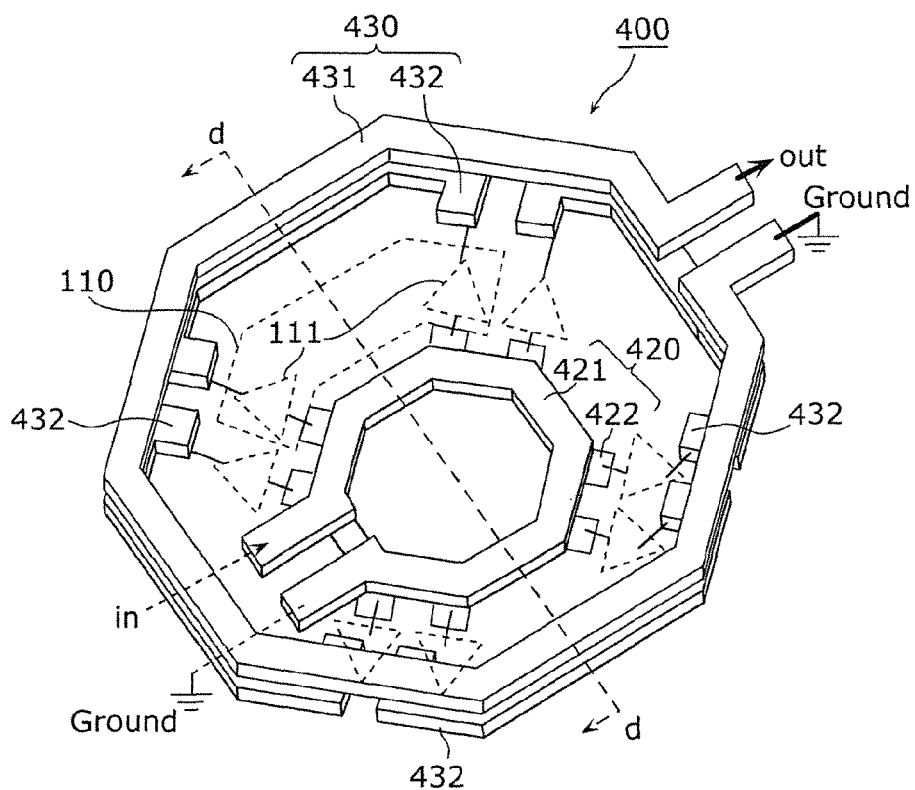
FIG. 9A is a schematic view showing an example of a structure of a power amplifier according to an embodiment 4.
Figure 9B:
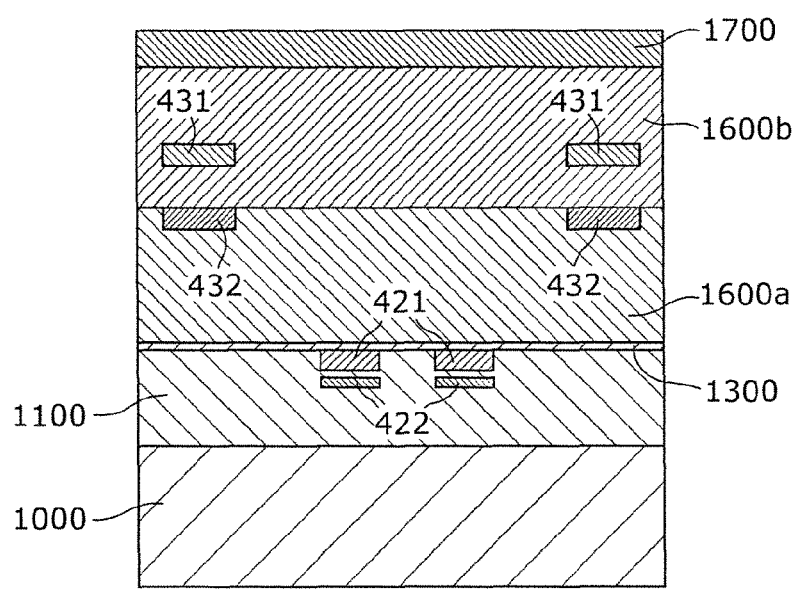
FIG. 9B is a diagram showing an example of a cross-sectional structure of the power amplifier according to the embodiment 4.

FIG. 9A is a schematic view showing an example of a structure of a power amplifier 400 according to the embodiment 4. FIG. 9B shows a cross-sectional structure along with a dashed line d-d shown in FIG. 9A. As shown in FIG. 9A, the power amplifier 400 includes a plurality of push-pull amplifiers 110, an input-side transformer 420, and an output-side transformer 430. The same reference signs will be used in the embodiment 4 to refer to the same components as those of the power amplifier 100 according to the embodiment 1, and the description will be omitted.

The input-side transformer 420 is by way of example of a first transformer, and has an annular primary coil 421 and a plurality of linear secondary coils 422. The input-side transformer 420 matches input impedance and divides the input signal into a plurality of split signals. The plurality of split signals is outputted to the plurality of push-pull amplifiers 110. The input-side transformer 420 is by way of example of a differential distribution transformer which provides the input signal as differential signals to the plurality of push-pull amplifiers 110. As shown in FIG. 9B, the input-side transformer 420 is formed in a back end processed dielectric layer 1100 by the silicon semiconductor process.

The annular primary coil 421 is by way of example of a first annular coil which includes a first metal line in an annular shape as a primary winding, and the input signal is inputted thereto. Specifically, as shown in FIG. 9A, the input signal is inputted to the annular primary coil 421 through one end, and the other end is grounded. Here, as an example, the input signal is inputted to the annular primary coil 421 through the one end and the other end is grounded. However, a differential input signal may be inputted to the annular primary coil 421 through both the ends.

The linear secondary coils 422 are by way of example of first linear coils which are second metal lines in a linear shape as secondary windings, and connected to the push-pull amplifiers 110. In other words, transistors 111 are connected to both ends of each of the linear secondary coils 422. The linear secondary coils 422 and the annular primary coil 421 are close to each other and magnetically coupled. Using the magnetic field coupling, the input-side transformer 420 divides the input signal inputted to the annular primary coil 421 into a plurality of split signals and outputs the plurality of split signals to the push-pull amplifiers 110.

The input-side transformer 420, the annular primary coil 421, and the linear secondary coils 422 are the same as the input-side transformer 120, the annular primary coil 121, and the linear secondary coils 122, respectively, according to the embodiment 1, or the input-side transformer 220, the annular primary coil 221, and the linear secondary coils 222, respectively, according to the embodiment 2, and thus the detailed description will be omitted.

The output-side transformer 430 is by way of example of a second transformer, and has an annular secondary coil 431 and a plurality of linear primary coils 432. The output-side transformer 430 combines a plurality of split signals amplified by the plurality of push-pull amplifiers 110 to output a resultant signal as the output signal and matches the output impedance. The output-side transformer 430 is by way of example of a differential combination transformer which combines the split signals which are differential signals amplified by the plurality of push-pull amplifiers 110. As shown in FIG. 9B, the output-side transformer 430 is formed in the post-passivation interconnection process dielectric layers 1600a and 1600b by the post-passivation interconnection process.

The annular secondary coil 431 is by way of example of a second annular coil which is a third metal line in an annular shape as a secondary winding, and outputs the output signal. Specifically, as shown in FIG. 9A, the output signal is outputted from the annular secondary coil 431 through the one end. In the present embodiment, the other end is grounded. However, the annular secondary coil 431 may be a differential output from which the output signal is also outputted through the other end.

The linear primary coils 432 are by way of example of second linear coils which are fourth metal lines in a linear shape as primary windings, and connected to the push-pull amplifiers 110. The linear primary coils 432 and the annular secondary coil 431 are close to each other and magnetically coupled. Using the magnetic field coupling, the output-side transformer 430 combines the plurality of split signals amplified by the plurality of push-pull amplifiers 110 and outputs a resultant signal from the annular secondary coil 431.

The output-side transformer 430, the annular secondary coil 431, and the linear primary coils 432 are the same as the output-side transformer 330, the annular secondary coil 331, and the linear primary coils 332, respectively, according to the embodiment 3, and thus the detailed description will be omitted.

The power amplifier 400 according to the embodiment 4 has the same circuit structure as the power amplifier 100 according to the embodiment 1 shown in FIG. 2, and thus the description will be omitted. The input-side transformer 420, the annular primary coil 421, the plurality of linear secondary coils 422, the output-side transformer 430, the annular secondary coil 431, and the plurality of linear primary coils 432 correspond to the input-side transformer 120, the annular primary coil 121, the plurality of linear secondary coils 122, the output-side transformer 130, the annular secondary coil 131, and the plurality of linear primary coils 132, respectively, in the circuit structure diagram shown in FIG. 2.

As described above, the input-side transformer 420 and the output-side transformer 430 included in the power amplifier 400 according to the embodiment 4 are formed using what is known as the inner layer lines and the post-passivation interconnection process, respectively.

As compared to the case where the input-side transformer and the output-side transformer are formed of only the inner layer lines or only the post-passivation interconnection process, the input-side transformer and the push-pull amplifiers and the output-side transformer can partially overlap one on the other in the present embodiment. Thus, further scaling down is possible.

While the power amplifier according to the present invention has been described based on the exemplary embodiments, the present invention is not limited to the exemplary embodiments. Various modifications to the present embodiments that may be conceived by those skilled in the art and combinations of components of different embodiments are intended to be included within the scope of the present invention, without departing from the spirit of the present invention.

Figure 10:
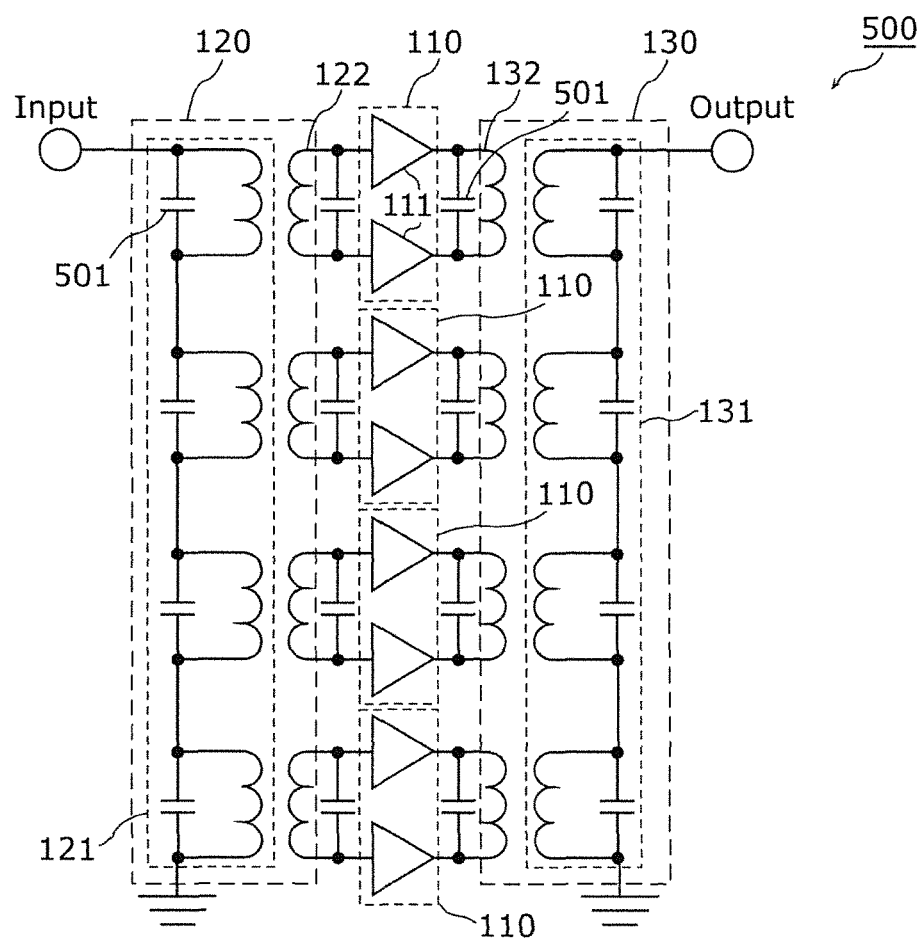
FIG. 10 is a diagram showing an example of a circuit configuration of a power amplifier according to a variation of the embodiments.

For example, a power amplifier 500 according to a variation of the embodiments may include, as shown in FIG. 10, capacitors 501 at differential parts for the input-side transformer 120 and the output-side transformer 130. Specifically, as shown in FIG. 10, in the annular primary coil 121, the capacitors 501 are inserted in regions in which the input-side transformer is partially formed by the plurality of linear secondary coils 122. In other words, the same number of capacitors 501 (four, in the example of FIG. 10) as the number of linear secondary coils 122 are connected in parallel to the first metal line.

In addition, the capacitors 501 are also inserted in the plurality of linear secondary coils 122. In other words, the capacitors 501 are connected in parallel to the second metal lines. The capacitors 501 are connected to the output-side transformer 130 in the same manner.

What is most important when designing the radio frequency circuit is to match input impedances and output impedance at desired frequencies. Otherwise, the signals are reflected at the input and output ends of the circuit, ending up with great losses.

Thus, in the power amplifier 500 according to the variation of the embodiments, preferably, the capacitors 501 as shown in FIG. 10 are inserted in parallel to each transformer to match the input impedance and the output impedance.

Figure 11:
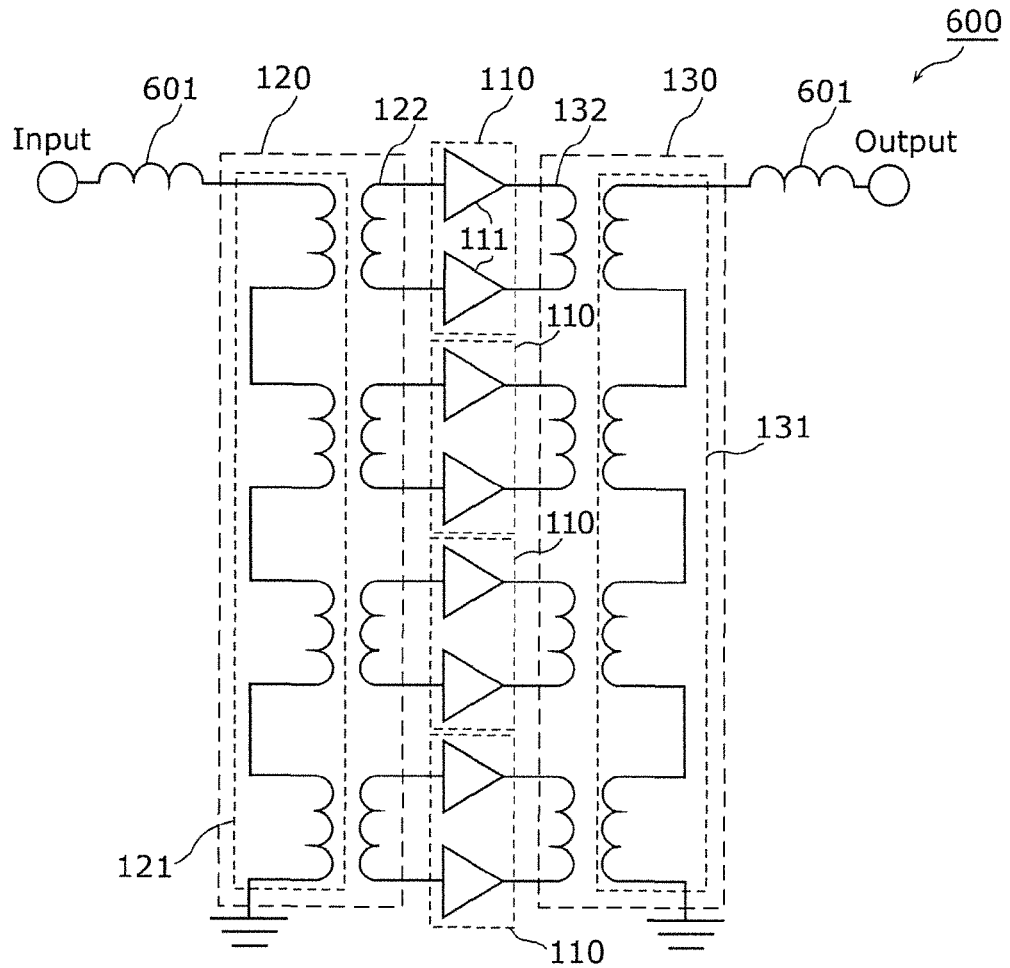
FIG. 11 is a diagram showing an example of a circuit configuration of the power amplifier according to the variation of the embodiments.

Moreover, a power amplifier 600 according to another variation of the embodiments may include, as shown in FIG. 11, inductors 601 at differential parts for the input-side transformer 120 and the output-side transformer 130. Specifically, as shown in FIG. 11, the inductor 601 is inserted to the input end of the annular primary coil 121. In other words, the inductor 601 is connected in series to the input end of the first metal line.

In the output-side transformer 130, the inductor 601 is inserted to the output end of the annular secondary coil 131. In other words, the inductor 601 is connected in series to the output end of the third metal line.

What is most important when designing the radio frequency circuit is to match input impedances and output impedance at desired frequencies. Otherwise, the signals are reflected at the input and output ends of the circuit, ending up with great losses.

Thus, in the power amplifier 600 according to the variation of the embodiments, preferably, the inductors 601 as shown in FIG. 11 are inserted to the input and output ends of each transformer to match the input impedance and the output impedance.

It should be noted that, of course, the variations shown in FIG. 10 and FIG. 11 can be combined to match the input impedance and the output impedance.

While the embodiments have been described in which the power amplifiers 100 to 600 each include four of the push-pull amplifiers 110, the present invention is not limited thereto. For example, the power amplifier 100 may include N (N is a natural number greater than or equal to 2) of the push-pull amplifiers 110.

In this case, the input-side transformer 120, 220, 320, or 420 includes N of the linear secondary coils 122, 222, 322, or 422, respectively, and divides the input signal into N split signals. Likewise, the output-side transformer 130, 230, 330, or 430 includes N of the linear primary coils 132, 232, 332, or 432, respectively, and combines N split signals amplified. The length of each of the linear secondary coils 122, 222, 322, or 422 is substantially 1/N times the length of the annular primary coil 121, 221, 321, or 421, respectively. Moreover, the length of each of the linear primary coils 132, 232, 332, or 432 is substantially 1/N times the length of the annular secondary coil 131, 231, 331, or 431, respectively.

While the embodiments have been described in which the annular primary coil 121, 221, 331, or 431 is formed in the same metal line layer in which the annular secondary coil 131, 231, 331, or 431, respectively, is formed, the present invention is not limited thereto. The annular primary coil 121, 221, 331, or 431 and the annular secondary coil 131, 231, 331, or 431, respectively, may be formed in different metal line layers.

Likewise, the linear secondary coils 122, 222, 322, or 422 and the linear primary coils 132, 232, 332, or 432, respectively, may also be formed in the same metal line layer, or may be formed in different metal line layers.

While the example has been shown in which the annular primary coil 121, 221, 321, or 421 and the annular secondary coil 131, 231, 331, or 431, respectively, are in octagon shapes, the shapes are not limited thereto and may be any, such as circular shapes and polygonal shapes (for example, rectangular shapes). Here, the linear secondary coils 122, 222, 322, or 422, and the linear primary coils 132, 232, 332, or 432, respectively, may not be in the linear shapes insofar as the shapes match shapes along the metal lines forming the annular coils. In this case, the losses at the input-side transformer 120, 220, 320 or 420, and the output-side transformers 130, 230, 330, or 430, respectively, can highly be reduced.

Moreover, for example, while the input-side transformer 120, 220, 320, or 420, and the output-side transformer 130, 230, 330, or 430 use the magnetic field coupling to divide and combine power, respectively, in the embodiments, other element whereby the power can be divided and combined may be used. Examples of such an element include Marchand baluns which convert, using the electric field coupling, an unbalanced signal propagating in an unbalanced line into a balanced signal propagating in a balanced line and vice versa, and can also perform impedance transformation. When the unbalanced signal is inputted to the balun through an unbalanced terminal, a pair of balanced signals having phases 180 degrees opposite to each other (anti-phase) and equal amplitudes are outputted from the balun through a balanced terminal. Thus, the same advantageous effects as those achieved by the embodiments can be achieved.

Figure 12A:
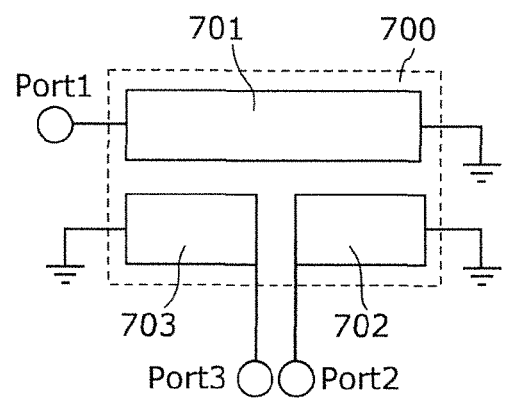
FIG. 12A is a diagram showing an example of a structure of a balun according to the variation of the embodiments.

First, referring to FIG. 12A, a circuit configuration of the balun will be described. A balun 700 includes an unbalanced line 701 and balanced lines 702 and 703. One end of the unbalanced line 701 is connected to a terminal Port1 and the other end is grounded. One end of the balanced line 702 is connected to a terminal Port2 and the other end is grounded. One end of the balanced line 703 is connected to a terminal Port3 and the other end is grounded.

According to the balun 700 having such a configuration, a radio frequency signal inputted to the unbalanced line 701 through the terminal Port1 is propagated into the balanced lines 702 and 703 by the electromagnetic coupling at a coupling part where the unbalanced line 701 and the balanced lines 702 and 703 face each other, and is outputted as balanced signals having phases 180 degrees opposite to each other through the terminals Port2 and Port3 to which the balanced lines 702 and 703 are connected, respectively.

Figure 12B:
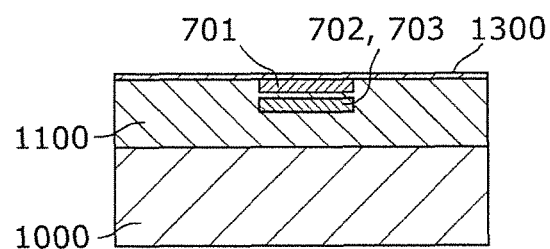
FIG. 12B is a diagram showing an example of a cross-sectional structure of the balun according to the variation of the embodiments.

FIG. 12B to FIG. 12E show examples of typical coupled lines for use in the balun. As descried in the structure of the transformers according to the embodiments, the unbalanced line 701 and the balanced lines 702 and 703 constitute, as shown in FIG. 12B, coupled lines using line layers in which different inner layer lines are formed, and can utilize the electric field coupling in the vertical direction.

Figure 12C:
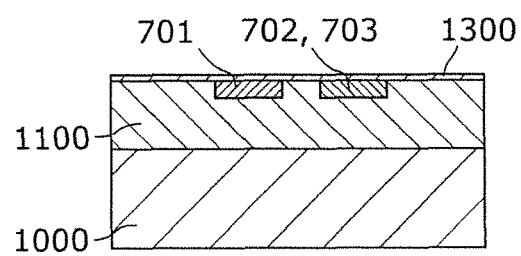
FIG. 12C is a diagram showing an example of a cross-sectional structure of the balun according to the variation of the embodiments.
Figure 12D:
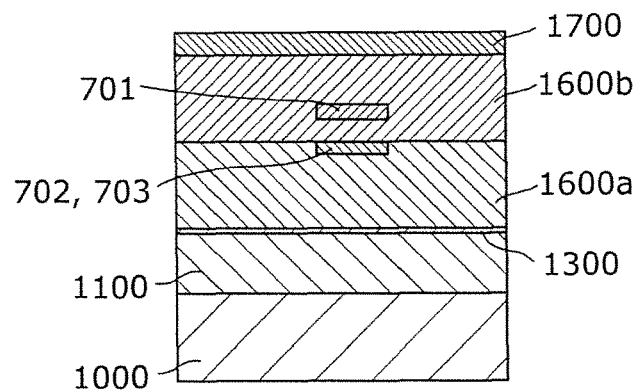
FIG. 12D is a diagram showing an example of a cross-sectional structure of the balun according to the variation of the embodiments.
Figure 12E:
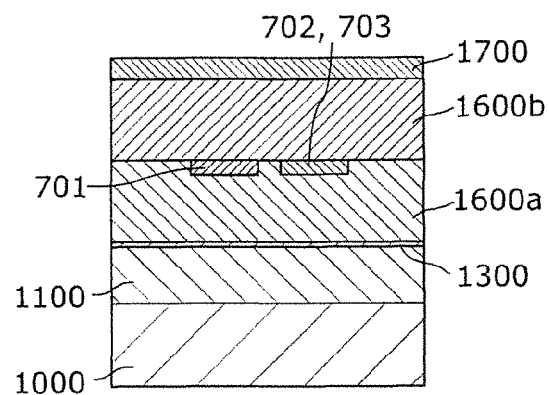
FIG. 12E is a diagram showing an example of a cross-sectional structure of the balun according to the variation of the embodiments.

Moreover, as shown in FIG. 12C, the unbalanced line 701 and the balanced lines 702 and 703 use the line layer in which the same inner layer lines are formed, to constitute coplanar-line-type coupled lines, and can utilize the electric field coupling in the horizontal direction. Furthermore, using the post-passivation interconnection process, as shown in FIG. 12D, the unbalanced line 701 and the balanced lines 702 and 703 constitute coupled lines using the post-passivation interconnection process upper and lower line layers, and can utilize the electric field coupling in the vertical direction. Alternatively, as shown in FIG. 12E, the unbalanced line 701 and the balanced lines 702 and 703 may use the post-passivation interconnection process upper or lower line layer to constitute the coplanar-line-type coupled lines, and utilize the electric field coupling in the horizontal direction.

Figure 13:
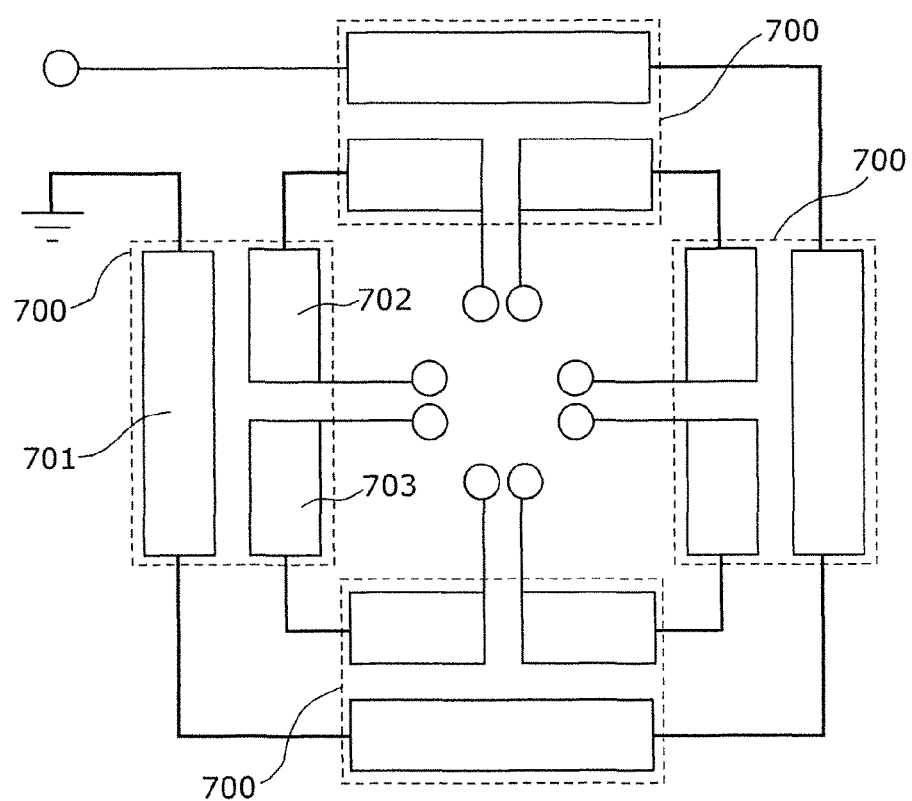
FIG. 13 is a diagram showing an example of a power divider/combiner using the balun according to the variation of the embodiments.

The configuration example of the balun has been described above. FIG. 13 shows a specific configuration of a divider/combiner using the baluns. The terminal Port1 to which the unbalanced line 701 of one balun 700 is connected is connected to an opposite end (the end originally grounded) of the unbalanced line 701 of the other balun 700, and thereby, a plurality of baluns 700 is connected to each other. This can achieve the annular line, as shown in FIG. 13, and achieves the same advantageous effects as those achieved by the annular primary coil 121, 221, 321, or 421, and the annular secondary coil 131, 231, 331, or 431, respectively.

The radio frequency signal inputted to the unbalanced line 701 is outputted as the balanced signals having the phases 180 degrees opposite to each other, through the terminals Port2 and Port3 to which the balanced line 702 and the balanced line 703 are connected, respectively. Thus, the same advantageous effects as those achieved by the linear primary coils 132, 232, 332, or 432, and the linear secondary coils 122, 222, 322, or 422, respectively, are achieved. Therefore, a plurality of the baluns 700 connected to each other can be used as the input-side transformer 120, 220, 320, or 420, and the output-side transformers 130, 230, 330, or 430, respectively.

Accordingly, the same advantageous effects as those achieved by the transformers according to the embodiments 1 to 4 can be achieved.

If the post-passivation interconnection process is employed to form the balun or the input-side and output-side transformers, further scaling down can be achieved. In the case of transformers, the greater the relative permeability is, the stronger the magnetic field of the magnetic field coupling per unit length is. Thus, the scaling down is possible. In the case of the balun, the greater the relative permeability is, the stronger the electric field of the electric field coupling per unit length is. Thus, the scaling down is possible. To that end, using, as a dielectric film, a nano-composite film formed by particles consisting of a first material dispersed in a second material, a dielectric film having a high relative permeability or a high relative permittivity can be achieved. Here, the "nano-composite film" refers to a film formed of a material comprising nanoscale particles consisting of the first material having a large relative permeability or a large relative permittivity dispersed in the second material having a small relative permeability or a small relative permittivity, respectively.

For example, the nano-composite film obtained by kneading and dispersing a high dielectric material nanoscale-particulated in BCB has high permittivity as compared to BCB. Examples of the high dielectric material include strontium titanium oxide (STO), barium strontium titanate (BST), barium titanate (BTO), hafnium oxide ($HfO_2$), hafnium aluminate ($HfAlO_2$), and lead zirconate titanate (PZT).

Here, the nanoscale-particles may have a size sufficient to be kneaded and dispersed in the second material. The smaller size is preferred. Specifically, preferably, the size is 1 µm or smaller, more preferably, 200 nm or smaller, and particularly, the nano-composite film, in which the nanoscale-particles having a size of 1 nm or greater and 200 nm or smaller are dispersed, can obtain good characteristics.

Moreover, the dielectric film is not limited to the nano-composite film, and may be obtained by stacking a BCB film and the nano-composite film, or stacking a plurality of nano-composite films having different relative permittivity. Such stacking increases the flexibility in setting the relative permeability or the relative permittivity of the entirety of the dielectric film, and allows flexibility in designing the transistors and balun.

Although only some exemplary embodiments of the present invention have been described in detail above, those skilled in the art will readily appreciate that many modifications are possible in the exemplary embodiments without materially departing from the novel teachings and advantages of the present invention. Accordingly, all such modifications are intended to be included within the scope of the present invention.

INDUSTRIAL APPLICABILITY

A power amplifier according to the present invention has advantageous effect of reducing losses in the input-side matching circuit and allowing for simplification and scale down of a circuit, and is applicable to power amplifiers utilizing, for example, radio frequency such as a millimeter wave.

The invention claimed is:

1. A power amplifier for amplifying an input signal and outputting the amplified input signal as an output signal, the power amplifier comprising:
a first transformer for matching input impedance and dividing the input signal into a plurality of split signals, the first transformer having a first metal line in an annular shape as a primary winding to which the input signal is inputted, and a plurality of second metal lines as a plurality of secondary windings;
a plurality of push-pull amplifiers, each push-pull amplifier including a pair of transistors for amplifying one of the plurality of split signals; and
a second transformer having a third metal line in an annular shape as a secondary winding from which the output signal is outputted, and a plurality of fourth metal lines as primary windings, for combining the plurality of split signals amplified by the plurality of push-pull amplifiers to output the output signal and matching output impedance,
wherein two input terminals of the pair of transistors are connected to each other via one of the second metal lines, and
two output terminals of the pair of transistors are connected to each other via one of the fourth metal lines.

2. The power amplifier according to claim 1,
wherein a combined length of the plurality of second metal lines is substantially equal to a length of the first metal line, and
a combined length of the plurality of fourth metal lines is substantially equal to a length of the third metal line.

3. The power amplifier according to claim 1,
wherein a mid-point of each of the second metal lines is connected to a first power source for supplying a first bias voltage to the pair of transistors, and
a mid-point of each of the fourth metal lines is connected to a second power source for supplying a second bias voltage to the pair of transistors.

4. The power amplifier according to claim 1,
wherein the first metal line is disposed inside the third metal line in the annular shape.

5. The power amplifier according to claim 4,
wherein the plurality of push-pull amplifiers are disposed between the first metal line and the third metal line.

6. The power amplifier according to claim 1,
wherein the first metal line and the plurality of second metal lines are formed in a same metal line layer, and the third metal line and the plurality of fourth metal lines are formed in a same metal line layer.

7. The power amplifier according to claim 1,
wherein the first metal line is formed in a metal line layer different from a metal line layer in which the plurality of second metal lines is formed, and
the third metal line is formed in a metal line layer different from a metal line layer in which the plurality of fourth metal lines is formed.

8. The power amplifier according to claim 1, further comprising
a dielectric layer having a thickness of 10 µm or greater, formed between a semiconductor substrate and at least one of the first transformer and the second transformer.

9. The power amplifier according to claim 8,
wherein the dielectric layer comprises benzocyclobutene, polyimide, polytetrafluoroethylene, or polyphenylene oxide.

10. The power amplifier according to claim 8,
wherein the dielectric layer includes a nano-composite film formed of particles, consisting of a first material, dispersed in a second material.

11. The power amplifier according to claim 1,
wherein at least one of the first transformer and the second transformer is formed using a balun.

12. The power amplifier according to claim 1,
wherein the plurality of second metal lines are electrically disconnected from each other.

13. The power amplifier according to claim 12,
wherein the plurality of push-pull amplifiers are disposed between the first transformer and the second transformer.

14. The power amplifier according to claim 1,
wherein the plurality of push-pull amplifiers are disposed between the first transformer and the second transformer.

15. The power amplifier according to claim 1,
wherein both the first metal line and the third metal line surround a same axis.

16. The power amplifier according to claim 1,
wherein the first metal line is disposed inside the third metal line.

17. The power amplifier according to claim 1,
wherein the plurality of second metal lines are disposed inside the first metal line.

18. The power amplifier according to claim 1, further comprising
a plurality of capacitors at differential parts for the first transformer and the second transformer.

* * * * *